US011621264B2

(12) United States Patent
Kim et al.

(10) Patent No.: US 11,621,264 B2
(45) Date of Patent: Apr. 4, 2023

(54) SEMICONDUCTOR MEMORY DEVICE

(71) Applicant: SAMSUNG ELECTRONICS CO., LTD., Suwon-si (KR)

(72) Inventors: Hyuncheol Kim, Seoul (KR); Yongseok Kim, Suwon-si (KR); Satoru Yamada, Yongin-si (KR); Sungwon Yoo, Hwaseong-si (KR); Kyunghwan Lee, Seoul (KR); Jaeho Hong, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/999,378

(22) Filed: Aug. 21, 2020

(65) Prior Publication Data
US 2021/0225842 A1 Jul. 22, 2021

(30) Foreign Application Priority Data

Jan. 20, 2020 (KR) ........................ 10-2020-0007347

(51) Int. Cl.
*H01L 27/102* (2006.01)
*H01L 29/24* (2006.01)
(Continued)

(52) U.S. Cl.
CPC ...... *H01L 27/1023* (2013.01); *H01L 27/0688* (2013.01); *H01L 27/1027* (2013.01);
(Continued)

(58) Field of Classification Search
CPC ............. H01L 27/1023; H01L 27/0688; H01L 27/1027; H01L 27/10802; H01L 29/24;
(Continued)

(56) References Cited

U.S. PATENT DOCUMENTS 7,456,439 B1  11/2008  Horch
7,670,887 B2   3/2010  Bucher et al.
(Continued)

FOREIGN PATENT DOCUMENTS

JP     2013-165220 A     8/2013
KR    10-1952510 B1     2/2019
KR    10-2019-0068095 A  6/2019

OTHER PUBLICATIONS

Lee et al., Adv. Elec. Materials, 5, 1800745 (2019).

*Primary Examiner* — Shouxiang Hu
(74) *Attorney, Agent, or Firm* — Lee IP Law, P.C.

(57) ABSTRACT

A semiconductor memory device may include a first electrode and a second electrode, which are spaced apart from each other in a first direction, and a first semiconductor pattern, which is in contact with both of the first and second electrodes. The first semiconductor pattern may include first to fourth sub-semiconductor patterns, which are sequentially disposed in the first direction. The first and fourth sub-semiconductor patterns may be in contact with the first and second electrodes, respectively. The first and third sub-semiconductor patterns may be of a first conductivity type, and the second and fourth sub-semiconductor patterns may be of a second conductivity type different from the first conductivity type. Each of the first to fourth sub-semiconductor patterns may include a transition metal and a chalcogen element.

16 Claims, 22 Drawing Sheets

(51) Int. Cl.
*H01L 29/66* (2006.01)
*H01L 29/87* (2006.01)
*H01L 29/74* (2006.01)
*H01L 27/108* (2006.01)
*H01L 27/06* (2006.01)

(52) U.S. Cl.
CPC ........ *H01L 27/10802* (2013.01); *H01L 29/24* (2013.01); *H01L 29/66363* (2013.01); *H01L 29/74* (2013.01); *H01L 29/87* (2013.01)

(58) Field of Classification Search
CPC ... H01L 29/66363; H01L 29/74; H01L 29/87; H01L 27/11517; H01L 27/11526; H01L 27/11551; H01L 27/0817
See application file for complete search history.

(56) References Cited

U.S. PATENT DOCUMENTS

| | | | |
|---|---|---|---|
| 9,240,478 | B2 | 1/2016 | Chang et al. |
| 9,361,966 | B2 | 6/2016 | Nemati et al. |
| 9,595,580 | B2 | 3/2017 | Shin et al. |
| 9,608,101 | B2 | 3/2017 | Kis et al. |
| 9,893,155 | B2 | 2/2018 | Shah |
| 9,899,390 | B2 | 2/2018 | Luan et al. |
| 10,217,513 | B2 | 2/2019 | Lee et al. |
| 2013/0037879 | A1* | 2/2013 | Filippini ............. H01L 29/7827 257/330 |
| 2017/0352665 | A1* | 12/2017 | Luan ........................ G11C 11/39 |
| 2018/0013020 | A1* | 1/2018 | Choi ................... H01L 31/0236 |
| 2019/0043863 | A1 | 2/2019 | Nagai et al. |
| 2020/0202918 | A1* | 6/2020 | Le ........................... G11C 11/39 |

\* cited by examiner

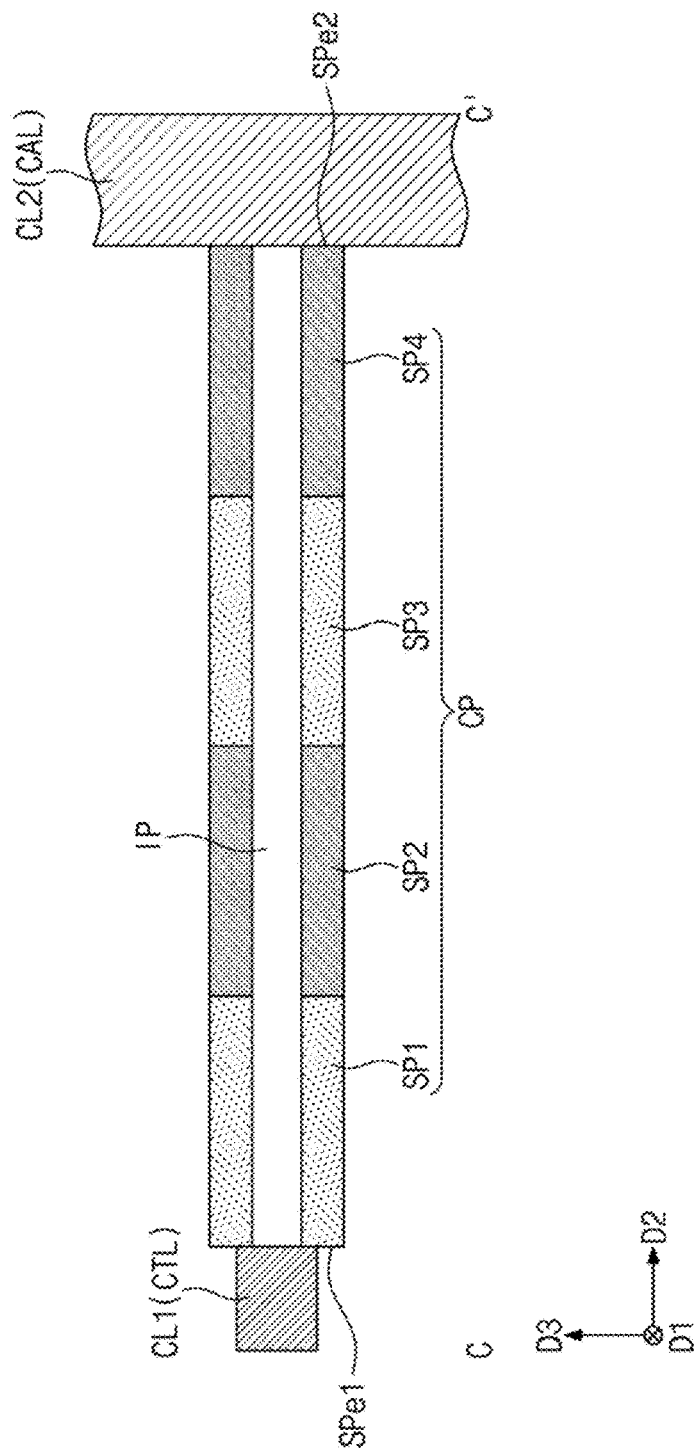

SEMICONDUCTOR MEMORY DEVICE

CROSS-REFERENCE TO RELATED APPLICATION

Korean Patent Application No. 10-2020-0007347, filed on Jan. 20, 2020, in the Korean Intellectual Property Office, and entitled: "Semiconductor Memory Device," is incorporated by reference herein in its entirety.

BACKGROUND

1. Field

Embodiments relate to a semiconductor memory device.

2. Description of the Related Art

Higher integration of semiconductor devices is important to provide superior performance and inexpensive prices. Increased integration is an important factor in determining product prices. In the case of two-dimensional or planar semiconductor devices, since their integration is mainly determined by the area occupied by a unit memory cell, integration is greatly influenced by the level of a fine pattern forming technology.

SUMMARY

Embodiments are directed to a semiconductor memory device, including a first electrode and a second electrode, which are spaced apart from each other in a first direction, and a first semiconductor pattern, which is in contact with both of the first electrode and the second electrode. The first semiconductor pattern may include first to fourth sub-semiconductor patterns, which are sequentially disposed in the first direction. The first sub-semiconductor pattern may be in contact with the first electrode, and the fourth sub-semiconductor pattern may be in contact with the second electrode. The first sub-semiconductor pattern and the third sub-semiconductor pattern may be of a first conductivity type, and the second sub-semiconductor pattern and the fourth sub-semiconductor pattern may be of a second conductivity type different from the first conductivity type. Each of the first to fourth sub-semiconductor patterns may include a transition metal and a chalcogen element.

Embodiments are also directed to a semiconductor memory device, including a first electrode and a second electrode spaced apart from each other in a first direction, a semiconductor pattern in contact with both of the first electrode and the second electrode, and a penetration insulating pattern penetrating the semiconductor pattern. The semiconductor pattern may include first to fourth sub-semiconductor patterns, which are sequentially disposed in the first direction, and the penetration insulating pattern may penetrate the first to fourth sub-semiconductor patterns. The first sub-semiconductor pattern may be in contact with the first electrode, and the fourth sub-semiconductor pattern may be in contact with the second electrode. The first sub-semiconductor pattern and the third sub-semiconductor pattern may be of a first conductivity type, and the second sub-semiconductor pattern and the fourth sub-semiconductor pattern may be of a second conductivity type different from the first conductivity type.

Embodiments are also directed to a semiconductor memory device, including a first electrode and a second electrode, which are spaced apart from each other in a first direction, and a semiconductor pattern, which is in contact with both of the first electrode and the second electrode. The first semiconductor pattern may include first to fourth sub-semiconductor patterns, which are sequentially disposed in the first direction. The first sub-semiconductor pattern and the third sub-semiconductor pattern may have a first width and a third width, respectively, in the first direction, and the third width may be n times the first width, where n may be a positive integer.

BRIEF DESCRIPTION OF THE DRAWINGS

Features will become apparent to those of skill in the art by describing in detail example embodiments with reference to the attached drawings in which:

FIG. 20A is a sectional view taken along the line C-C' of FIG. 14.

DETAILED DESCRIPTION

Figure 1:
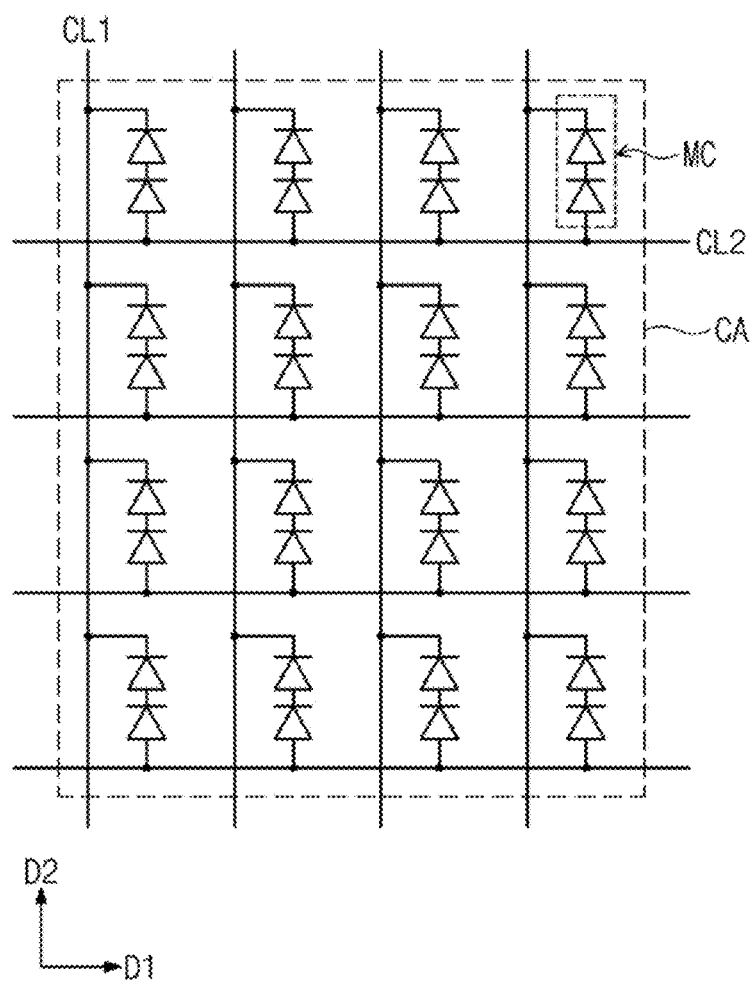
FIG. 1 is a circuit diagram schematically illustrating a cell array of a semiconductor memory device according to an example embodiment.

FIG. 1 is a circuit diagram schematically illustrating a cell array of a semiconductor memory device according to an example embodiment.

Referring to FIG. 1, a semiconductor memory device may include a cell array CA. The cell array CA may include first conductive lines CL1 and second conductive lines CL2, which are disposed to cross each other, and a plurality of memory cells MC, which are placed at respective intersections of the first and second conductive lines CL1 and CL2. The first conductive lines CL1 may be spaced apart from each other in a first direction D1 and may extend in a second direction D2 crossing the first direction D1. The second conductive lines CL2 may be spaced apart from each other in the second direction D2 and may extend in the first direction D1. The conductive line may be, for example, an electrode.

Each of the memory cells MC may be, for example, a thyristor, the first conductive line CL1 may be, for example, a cathode line, and the second conductive line CL2 may be, for example, an anode line. The semiconductor memory device may be, for example, a thyristor device. The thyristor may include a first diode and a second diode, which are connected in series.

In the case where a same forward bias voltage is applied to a thyristor, an amount of current flowing through the thyristor may be large when the thyristor is in a high conductance state, or may be small or substantially zero when in a low conductance state. The high and low conductance states of the thyristor may be used to realize "1" and "0" states of the semiconductor memory device according to the present example embodiment.

An operation of the semiconductor memory device may include a latch step of turning on a selected one of the memory cells MC from an Off state to an On state (for example, from the "0" state to the "1" state), and a hold step of preserving the memory cell MC in the On state (for example, the "1" state). The minimum value of an anode current required for the latch step may be referred to as a latching current, and the minimum value of an anode current required for the hold step may be referred to as a holding current.

Figure 2A:
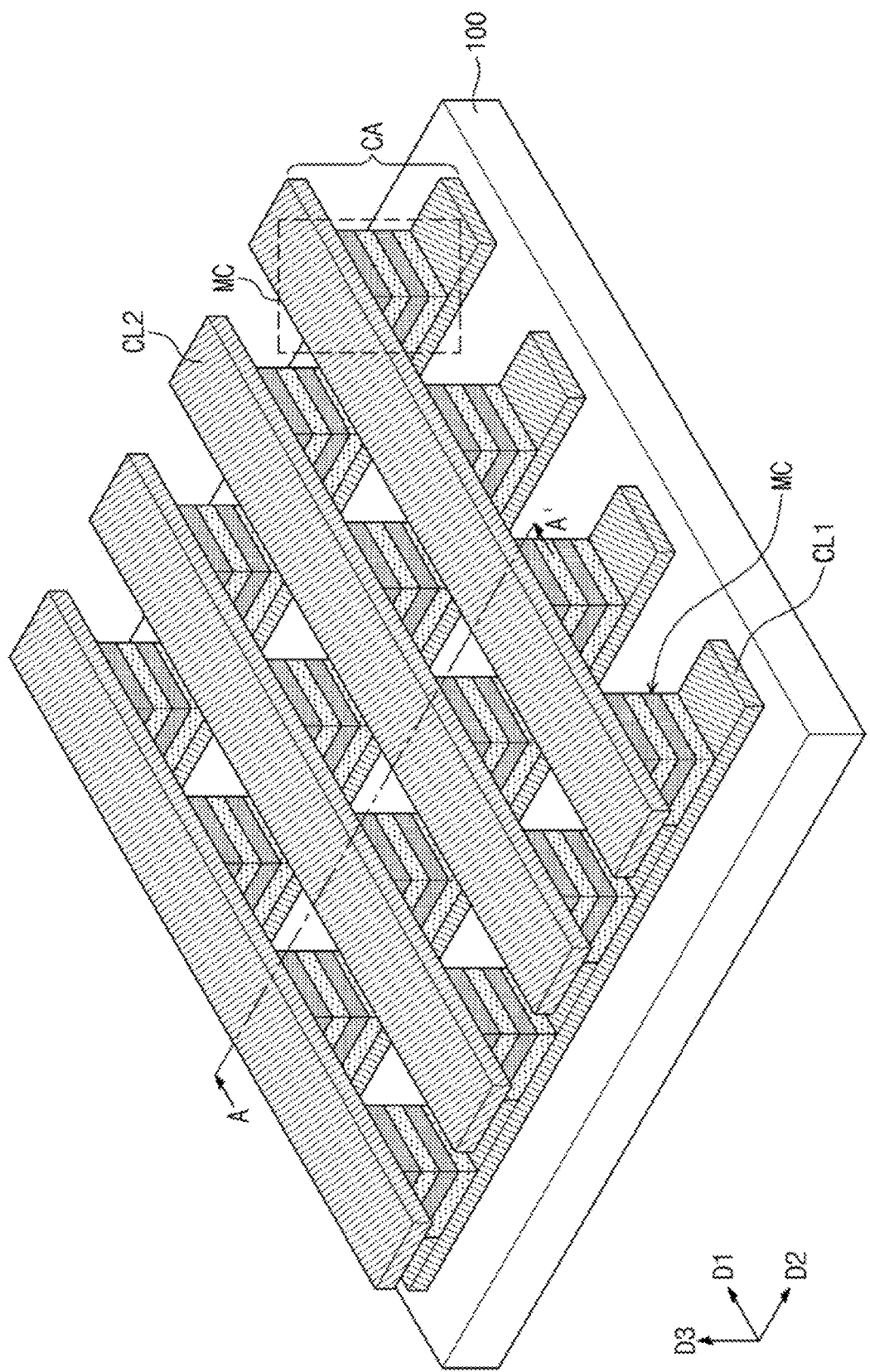
FIG. 2A is a perspective view of a semiconductor memory device having the circuit diagram of FIG. 1, according to an example embodiment.
Figure 2B:
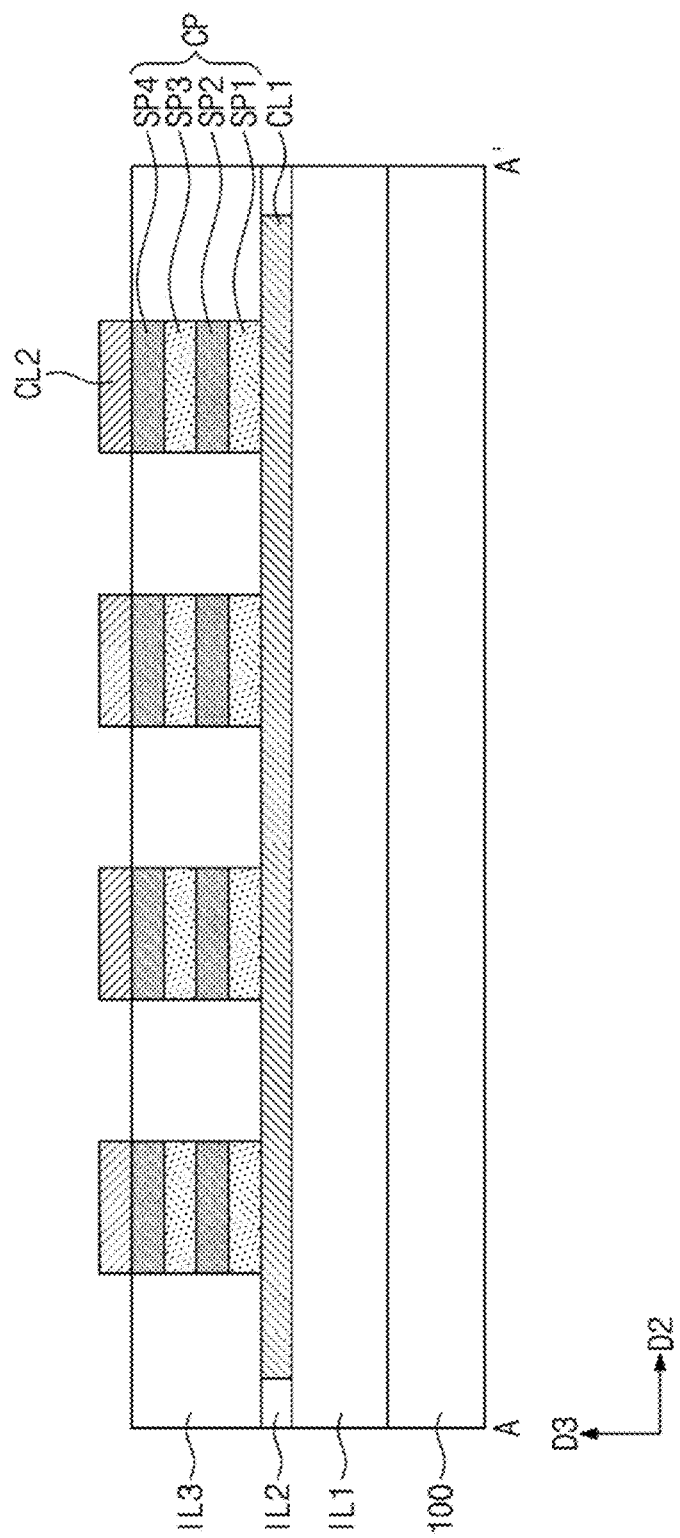
FIG. 2B is a sectional view taken along a line A-A' of FIG. 2A.

FIG. 2A is a perspective view of a semiconductor memory device having the circuit diagram of FIG. 1, according to an example embodiment. FIG. 2B is a sectional view taken along a line A-A' of FIG. 2A. FIG. 2A illustrates a structure, from which first to third interlayer insulating layers are omitted.

Referring to FIGS. 2A and 2B, a first interlayer insulating layer IL1 may be disposed on a substrate 100. The substrate 100 may be, for example, a single crystalline silicon substrate, an epitaxial silicon layer, or a silicon-on-insulator (SOI) substrate. Transistors may be disposed on the substrate 100, and the first interlayer insulating layer IL1 may cover the transistors. In addition, an interconnection layer may be disposed in the first interlayer insulating layer IL1. The first conductive lines CL1 may be disposed on the first interlayer insulating layer. The first conductive lines CL1 may be spaced apart from each other in the first direction D1 and may extend in the second direction D2. A space between the first conductive lines CL1 may be filled with a second interlayer insulating layer IL2. A plurality of semiconductor patterns CP may be disposed on the first conductive lines CL1. The semiconductor patterns CP may be channel patterns. A space between the semiconductor patterns CP may be filled with a third interlayer insulating layer IL3. The second conductive lines CL2 may be disposed on the semiconductor patterns CP, respectively. Each of the first to third interlayer insulating layers ILL IL2, and IL3 may have a single- or multi-layered structure including one or more of, for example, a silicon oxide layer, a silicon nitride layer, a silicon oxynitride layer, or a porous insulating layer. The first conductive lines CL1 and the second conductive lines CL2 may be formed of or include one or more of, for example, doped polysilicon, metal nitrides (for example, titanium nitride, tungsten nitride, and tantalum nitride), metal silicides (for example, cobalt silicide), or metal-containing materials (for example, tungsten, copper, and aluminum), and may have a single- or multi-layered structure.

The first conductive lines CL1 and the second conductive lines CL2 may be disposed to cross each other. The memory cells MC may be respectively disposed at intersections of the first conductive lines CL1 and the second conductive lines CL2. The first conductive lines CL1, the second conductive lines CL2, and the memory cells MC may constitute the cell array CA of a single layer. A plurality of the cell arrays CA may be stacked on the substrate 100 in a third direction D3 perpendicular to a top surface of the substrate 100.

Figure 3:
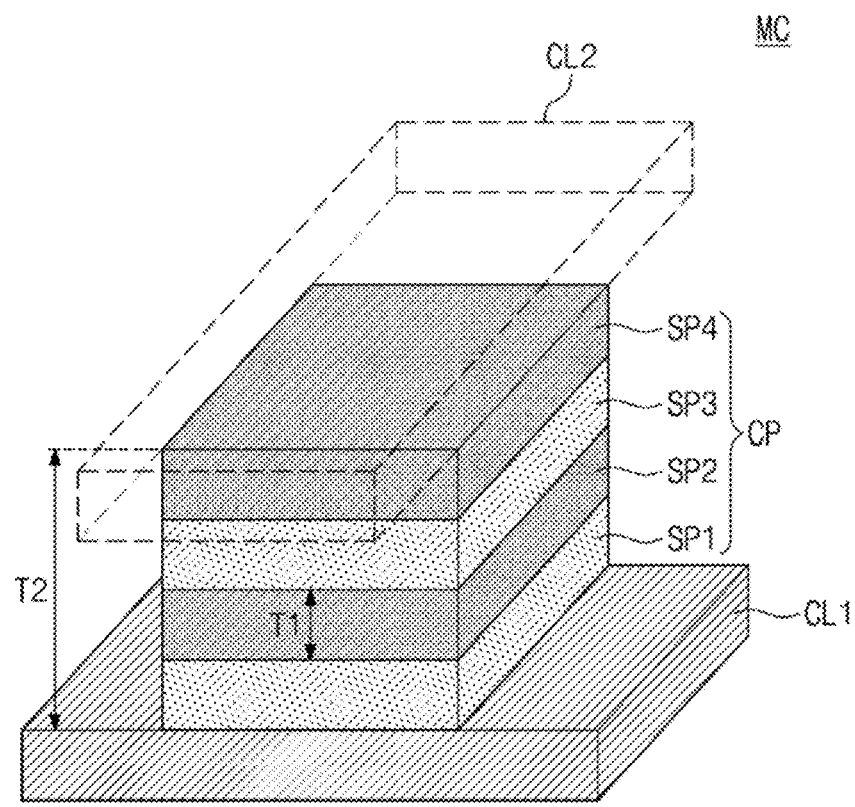
FIG. 3 is an enlarged perspective view illustrating a memory cell of FIG. 2A, according to an example embodiment.

FIG. 3 is an enlarged perspective view illustrating a memory cell of FIG. 2A, according to an example embodiment.

Referring to FIG. 3, the memory cell MC may include a portion of the first conductive line CL1, a portion of the second conductive line CL2, and the semiconductor pattern CP interposed therebetween. The semiconductor pattern CP may include first to fourth sub-semiconductor patterns SP1-SP4, which are sequentially stacked in the third direction D3. The first and second sub-semiconductor patterns SP1 and SP2 may correspond to a first diode constituting the memory cell MC of FIG. 1, and the third and fourth sub-semiconductor patterns SP3 and SP4 may correspond to a second diode constituting the memory cell MC of FIG. 1. Each of the first to fourth sub-semiconductor patterns SP1-SP4 may have, for example, a rectangular, tetragonal, circular, or elliptical shape, when viewed in a plan view. The first and third sub-semiconductor patterns SP1 and SP3 may be of a first conductivity type, and the second and fourth sub-semiconductor patterns SP2 and SP4 may be of a second conductivity type that is different from the first conductivity type. For example, the first conductivity type may be an n-type, and the second conductivity type may be a p-type.

In an example embodiment, each of the first to fourth sub-semiconductor patterns SP1-SP4 may be a two-dimensional semiconductor material. The first to fourth sub-semiconductor patterns SP1-SP4 may have a two-dimensional grid structure, and a height of one layer in the grid structure may range from, for example, 0.1 nm to 1 nm. The first to fourth sub-semiconductor patterns SP1-SP4 may have a grid structure of a very small thickness. Thus, a total vertical size of the semiconductor pattern CP may be reduced. Accordingly, it may be possible to realize a highly-integrated semiconductor memory device.

In an example embodiment, each of the first to fourth sub-semiconductor patterns SP1-SP4 may include a two-dimensional semiconductor material having a single-layered grid structure. Each of the first to fourth sub-semiconductor patterns SP1-SP4 may have a first thickness T1 in the third direction D3. In an example embodiment, the first thickness T1 may be, for example, about 0.7 nm. The memory cell MC may have a second thickness T2 in the third direction D3. In an example embodiment, the second thickness T2 may range from, for example, about 2.8 nm to about 3.0 nm.

In an example embodiment, each of the first to fourth sub-semiconductor patterns SP1-SP4 may include a transition metal and a chalcogen element. Each of the first to fourth sub-semiconductor patterns SP1-SP4 may include a chalcogen element whose amount does not meet a stoichiometric ratio thereof (for example, a nonstoichiometric chalcogenide). The material that is included in the first to fourth sub-semiconductor patterns SP1-SP4 may be a transition metal dichalcogenide (TMDC). The transition metal may be, for example, tungsten (W) or molybdenum (Mo). The chalcogen element may be, for example, sulfur (S), selenium (Se), or tellurium (Te).

In an example embodiment, the first and third sub-semiconductor patterns SP1 and SP3 may be formed of or include $MoS_a$ or $WS_b$, and the second and fourth sub-semiconductor patterns SP2 and SP4 may be formed of or include $MoSe_c$ or $WSe_d$, wherein the subscripts a to d are each independently positive real numbers that are equal to or less than 2. The subscripts a and c may be the same as each other or may be different from each other.

As the subscripts a and c become smaller than 2, an amount of electrons in the first and third sub-semiconductor patterns SP1 and SP3 may be increased, and in this case, the first and third sub-semiconductor patterns SP1 and SP3 may behave more like an n-type semiconductor material. The subscripts b and d may be the same as each other or may be different from each other. As the subscripts b and d become smaller than 2, an amount of holes in the second and fourth sub-semiconductor patterns SP2 and SP4 may be increased, and in this case, the second and fourth sub-semiconductor patterns SP2 and SP4 may behave more like a p-type semiconductor material.

In an example embodiment, the subscript c may be greater than the subscript a. The subscript b may be greater than the subscript d. Accordingly, an amount of electrons in the third sub-semiconductor pattern SP3 may be smaller than an amount of electrons in the first sub-semiconductor pattern SP1. In addition, an amount of holes in the second sub-semiconductor pattern SP2 may be smaller than an amount of holes in the fourth sub-semiconductor pattern SP4. Such a difference between the amounts of electrons and holes may lead to a change in energy band gap therebetween and may reduce an amount of electron-hole recombination occurring in a border between the second and third sub-semiconductor patterns SP2 and SP3. Accordingly, the holding current may be reduced.

In an example embodiment, in order to represent n- and p-type semiconductor behaviors or to increase an amount of electrons or holes, at least one of the subscripts a to d may be greater than 2.

Figure 4:
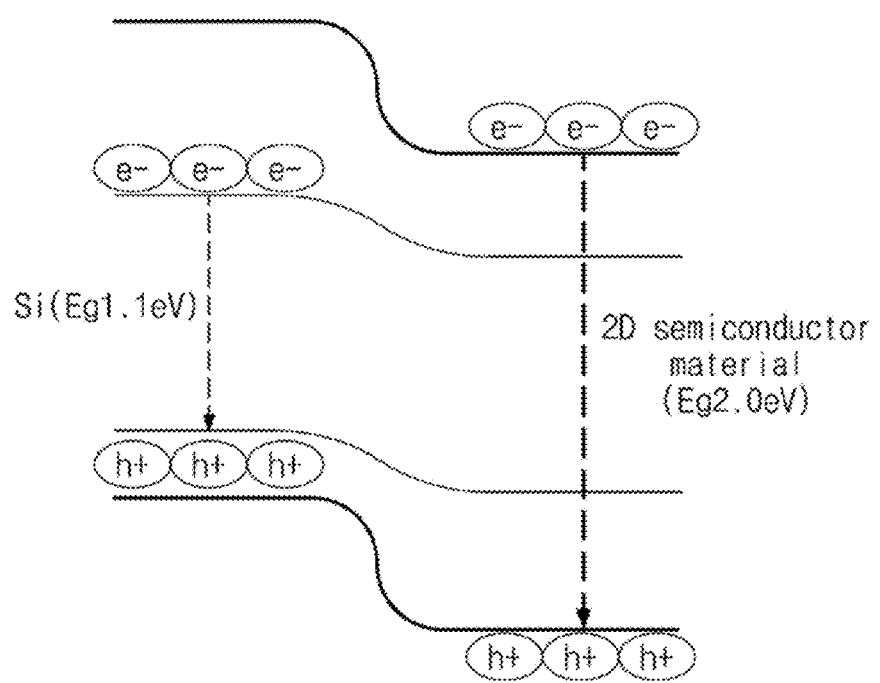
FIG. 4 is an energy band diagram illustrating energy band gaps of sub-semiconductor patterns and silicon, according to an example embodiment.

FIG. 4 is an energy band diagram illustrating energy band gaps of sub-semiconductor patterns and silicon, according to an example embodiment.

Referring to FIG. 4, each of the first to fourth sub-semiconductor patterns SP1-SP4 may include a material whose energy band gap is larger than that of silicon. For example, the energy band gap of silicon may be about 1.1 eV, and the energy band gap of each of the first to fourth sub-semiconductor patterns SP1-SP4 may be about 2.0 eV.

In the hold step of the semiconductor memory device, it is necessary to additional electrons are supplied in an amount that is larger than an amount of electrons to be lost by the electron-hole recombination. Such additional electrons may constitute the holding current. In an example embodiment, each of the first to fourth sub-semiconductor patterns SP1-SP4 are formed of a material whose energy band gap is greater than the energy band gap of silicon. Thus the electron-hole recombination may be suppressed, compared with the electron-hole recombination in silicon. Due to such suppression of the electron-hole recombination, it may be possible to reduce the amount of additional electrons that are supplied and consequently to reduce the holding current. Accordingly, the semiconductor memory device may be operated with low power consumption.

The semiconductor memory device of FIG. 2B may be fabricated by the following method.

Referring to FIG. 2B, the first interlayer insulating layer IL1 may be formed on the substrate 100. The first conductive lines CL1 may be formed by forming a conductive layer on the first interlayer insulating layer IL1 and patterning the conductive layer. The second interlayer insulating layer IL2 may be formed on the first conductive lines CL1 and may be etched in an etch-back manner to expose the first conductive lines CL1. First to fourth sub-semiconductor layers may be sequentially formed on the second interlayer insulating layer IL2 and the first conductive lines CL1. The first to fourth sub-semiconductor layers may be formed of or include a two-dimensional semiconductor material. The materials for the materials of the first to fourth sub-semiconductor layers may be the same as the materials for the first to fourth sub-semiconductor patterns SP1-SP4. The first to fourth sub-semiconductor layers may be formed by, for example, a chemical vapor deposition (CVD) or atomic layer deposition (ALD) process. An etching process may be performed to pattern the first to fourth sub-semiconductor layers, thereby forming the first to fourth sub-semiconductor patterns SP1-SP4 constituting the semiconductor patterns CP. The third interlayer insulating layer IL3 may be formed to fill a space between the semiconductor patterns CP. The second conductive lines CL2 may be formed on the semiconductor patterns CP.

Figure 5:
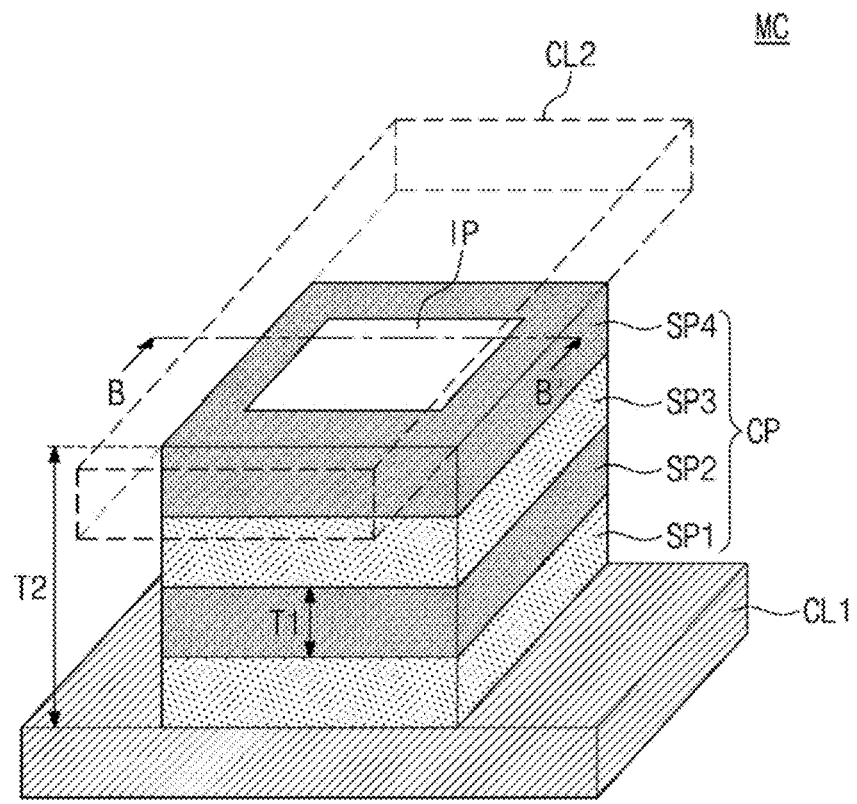
FIG. 5 is an enlarged perspective view illustrating the memory cell of FIG. 2A, according to an example embodiment.
Figure 6:
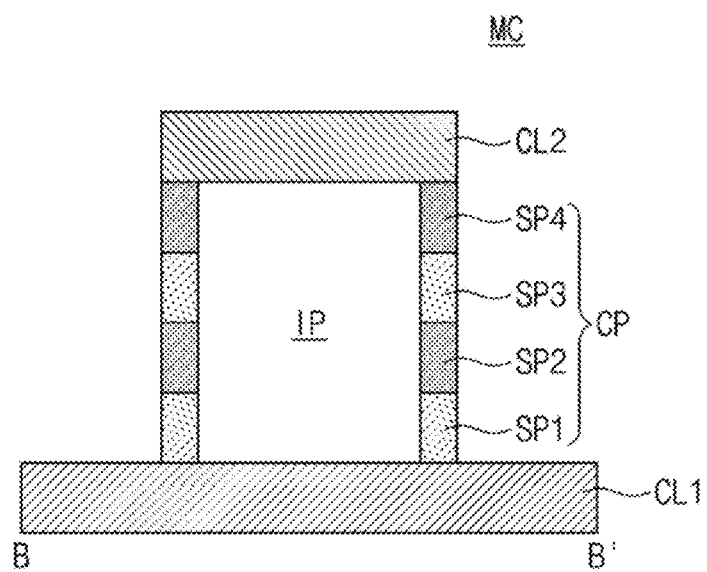
FIG. 6 is a sectional view taken along a line B-B' of FIG. 5.

FIG. 5 is an enlarged perspective view illustrating the memory cell of FIG. 2A, according to an example embodiment. FIG. 6 is a sectional view taken along a line B-B' of FIG. 5.

Referring to FIGS. 5 and 6, a penetration insulating pattern IP may be provided to penetrate the first to fourth sub-semiconductor patterns SP1-SP4 and to be in contact with the first and second conductive lines CL1 and CL2. The penetration insulating pattern IP may have, for example, a rectangular, tetragonal, circular, or elliptical shape when viewed in a plan view. Each of the first to fourth sub-semiconductor patterns SP1-SP4 may be provided to surround the penetration insulating pattern IP and may have a toroidal or doughnut shape. The penetration insulating pattern IP may include one or more of, for example, a silicon oxide layer, a silicon nitride layer, a silicon oxynitride layer, a porous insulating layer, a metal oxide layer, or a metal nitride layer, and may have a single- or multi-layered structure. Accordingly, each of the first to fourth sub-semiconductor patterns SP1-SP4 may have a relatively small width. Thus, it may be possible to reduce the number of current paths formed between the second conductive line CL2 and the first conductive line CL1. This may make it possible to reduce the probability of electron-hole recombination and consequently to reduce the holding current.

Figure 7:
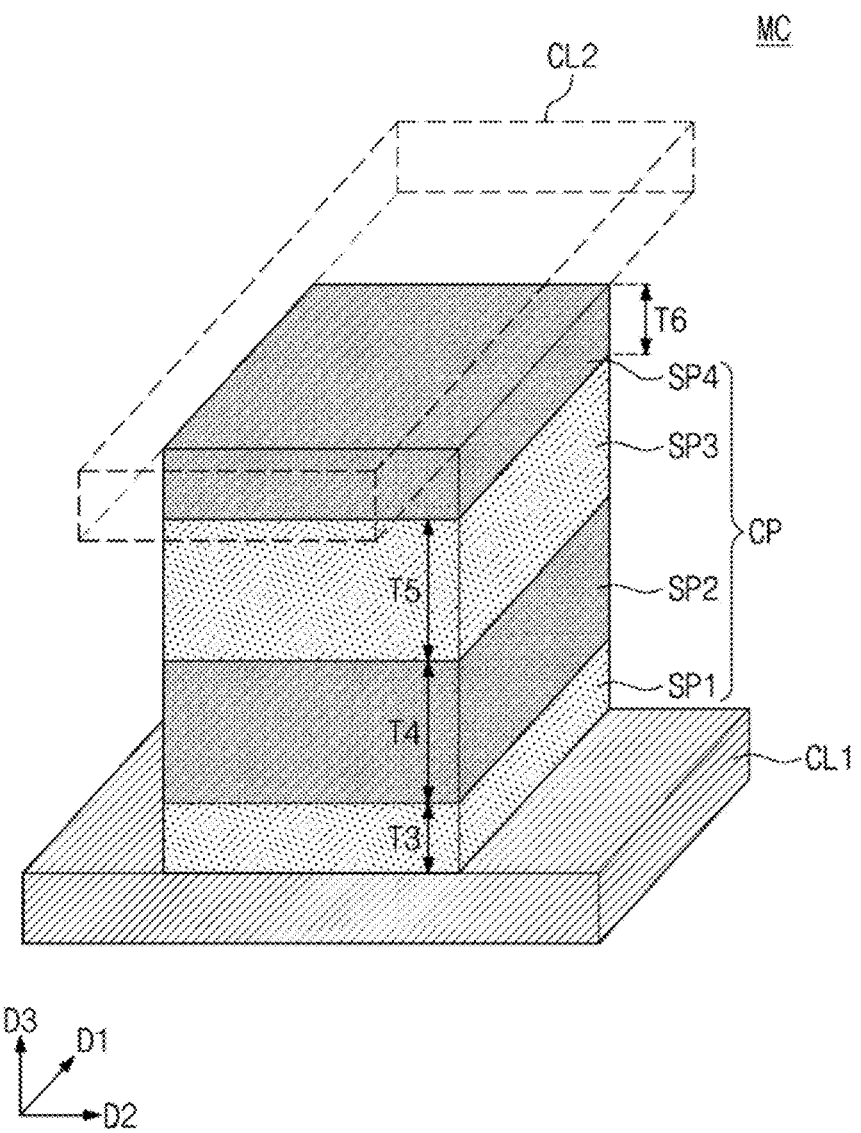
FIG. 7 is an enlarged perspective view illustrating the memory cell of FIG. 2A, according to an example embodiment.

FIG. 7 is an enlarged perspective view illustrating the memory cell of FIG. 2A, according to an example embodiment.

Referring to FIG. 7, the first sub-semiconductor pattern SP1 may have a third thickness T3 in the third direction D3. The second sub-semiconductor pattern SP2 may have a fourth thickness T4 in the third direction D3. The third sub-semiconductor pattern SP3 may have a fifth thickness T5 in the third direction D3. The fourth sub-semiconductor pattern SP4 may have a sixth thickness T6 in the third direction D3.

The fourth thickness T4 may be greater than the sixth thickness T6. The fifth thickness T5 may be greater than the third thickness T3. The first to fourth sub-semiconductor patterns SP1-SP4 may have a two-dimensional layered grid structure, and the fourth thickness T4 may be n times the sixth thickness T6, and the fifth thickness T5 may be m times the third thickness T3, where each of the numbers n and m is a positive integer.

In this structure, the energy band gap may be changed due to such a thickness difference, and in this case, a difference in energy level between a starting point and an ending point in the memory cell MC, through which the current passes, may be increased. Accordingly, the holding current may be reduced.

Figure 8:
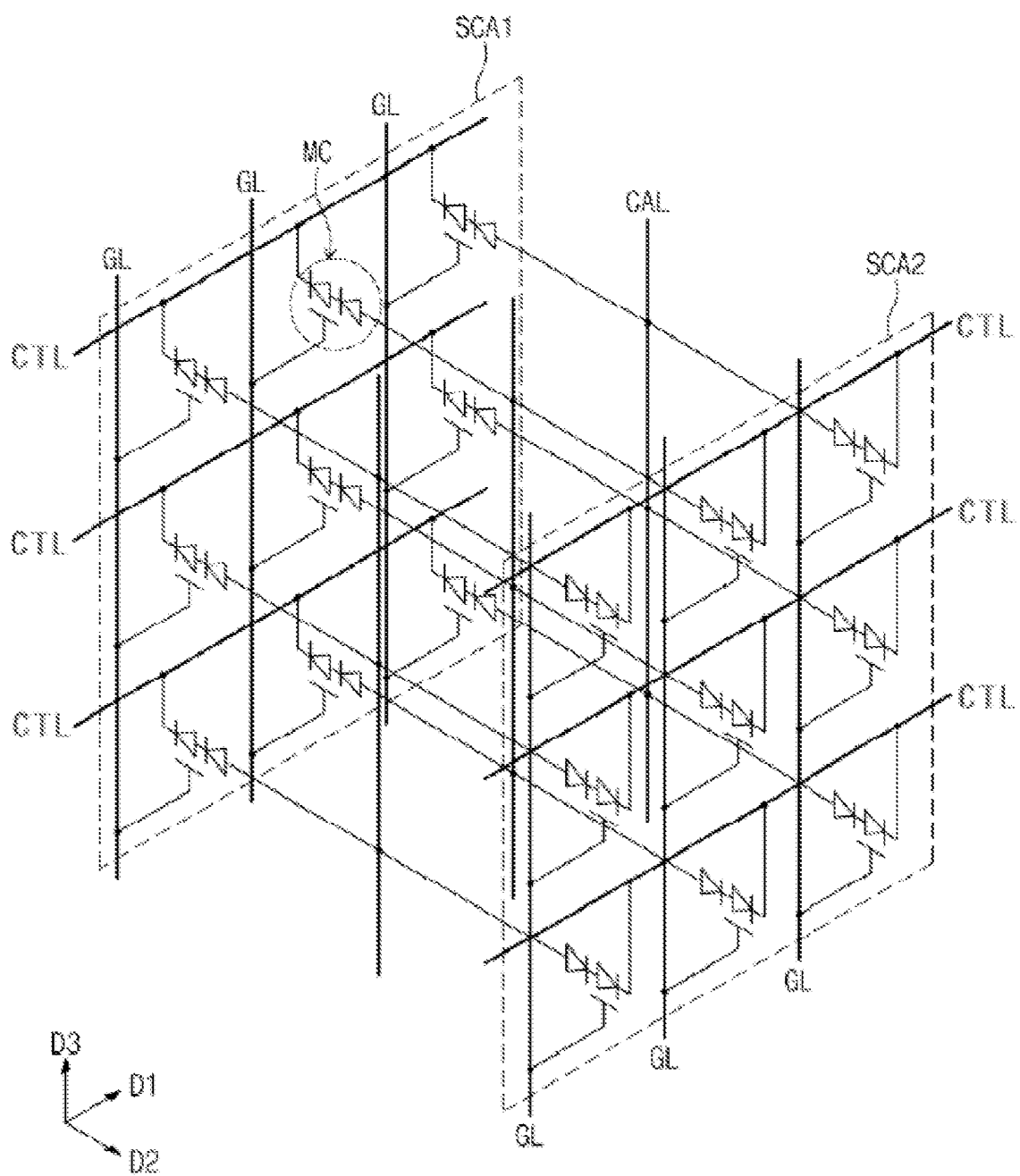
FIG. 8 is a circuit diagram schematically illustrating a cell array of a three-dimensional semiconductor memory device, according to an example embodiment.

FIG. 8 is a circuit diagram schematically illustrating a cell array of a three-dimensional semiconductor memory device, according to an example embodiment.

Referring to FIG. 8, a cell array of a three-dimensional semiconductor memory device according to an embodiment may include a plurality of sub-cell arrays SCA. The sub-cell arrays SCA may be arranged in the second direction D2.

Each of sub-cell arrays SCA1 and SCA2 may include a plurality of cathode lines CTL, a plurality of gate lines GL, and a plurality of the memory cells MC. Each of the memory cells MC may be disposed between a corresponding pair of the gate and cathode lines GL and CTL.

Each of the memory cells MC may be a data storing element that is composed of one thyristor. In an example embodiment, each of the memory cells MC may have a capacitor-free structure. The memory device according to the present example embodiment may be a thyristor DRAM, which does not include a capacitor. The thyristor may include a first diode, a second diode, and a gate connected to the first diode.

The cathode lines CTL may be conductive patterns (for example, metal lines), which are provided over the substrate or are vertically spaced apart from the substrate. The cathode lines CTL may extend in the first direction D1. The cathode lines CTL in each of the sub-cell arrays SCA1 and SCA2 may be spaced apart from each other in a vertical direction (that is, the third direction D3).

The gate lines GL may be conductive patterns (for example, metal lines) extending in the vertical or third direction D3, which is perpendicular to the top surface of the substrate. In each of the sub-cell arrays SCA1 and SCA2, the gate lines GL may be spaced apart from each other in the first direction D1.

Common anode lines CAL may be provided between a pair of the sub-cell arrays SCA1 and SCA2, which are adjacent to each other in the second direction D2. The common anode lines CAL may be conductive patterns (for example, metal lines) extending in the vertical direction (that is, the third direction D3). The common anode lines CAL may be spaced apart from each other in the first direction D1.

Each of the common anode lines CAL may be connected in common to a pair of the memory cells MC, which are adjacent to each other in the second direction D2. For example, each of the common anode lines CAL may be connected in common to a pair of the memory cells MC, which are adjacent to each other at the same level.

Figure 9:
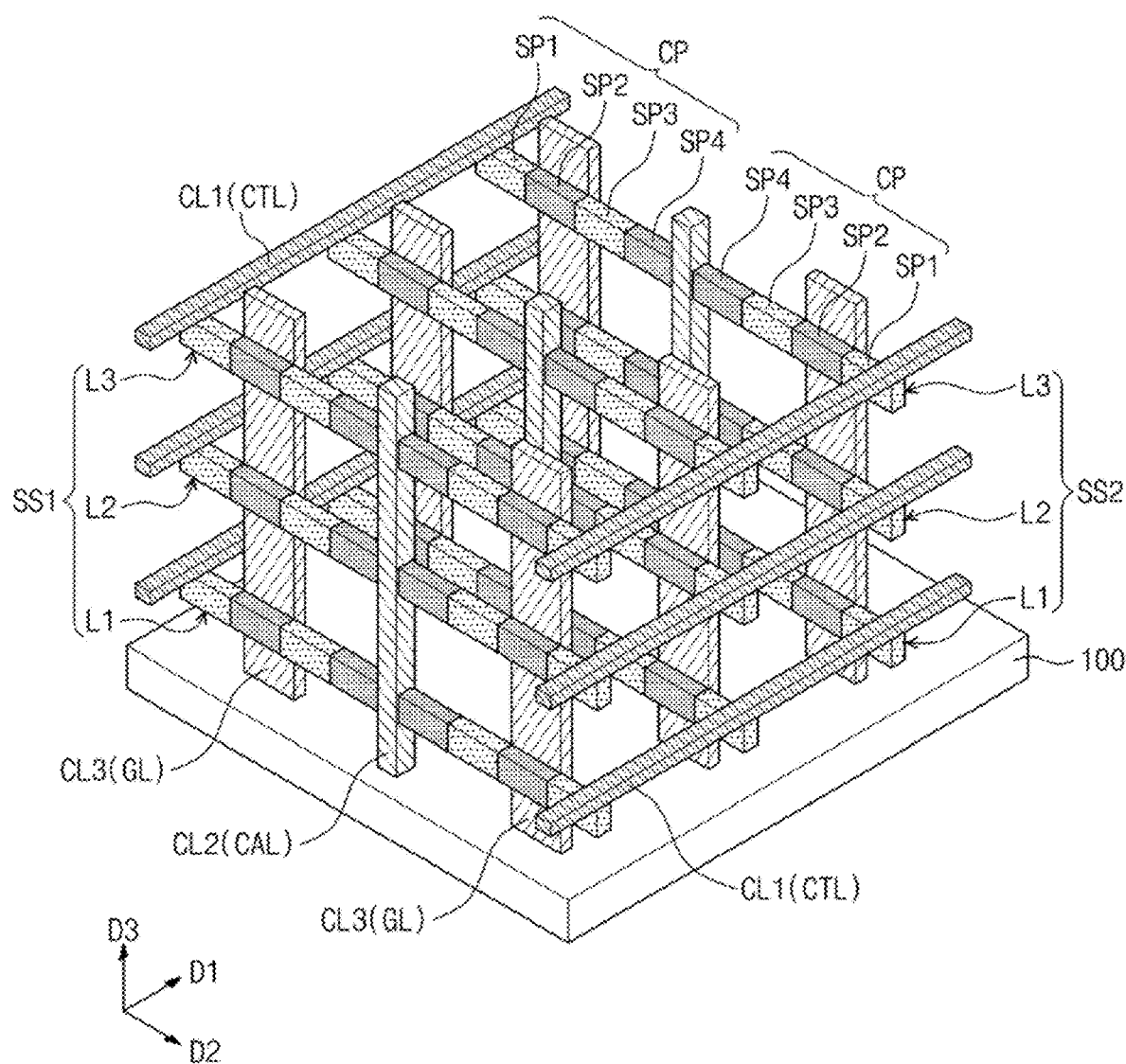
FIG. 9 is a perspective view illustrating a three-dimensional semiconductor memory device according to an example embodiment.
Figure 10:
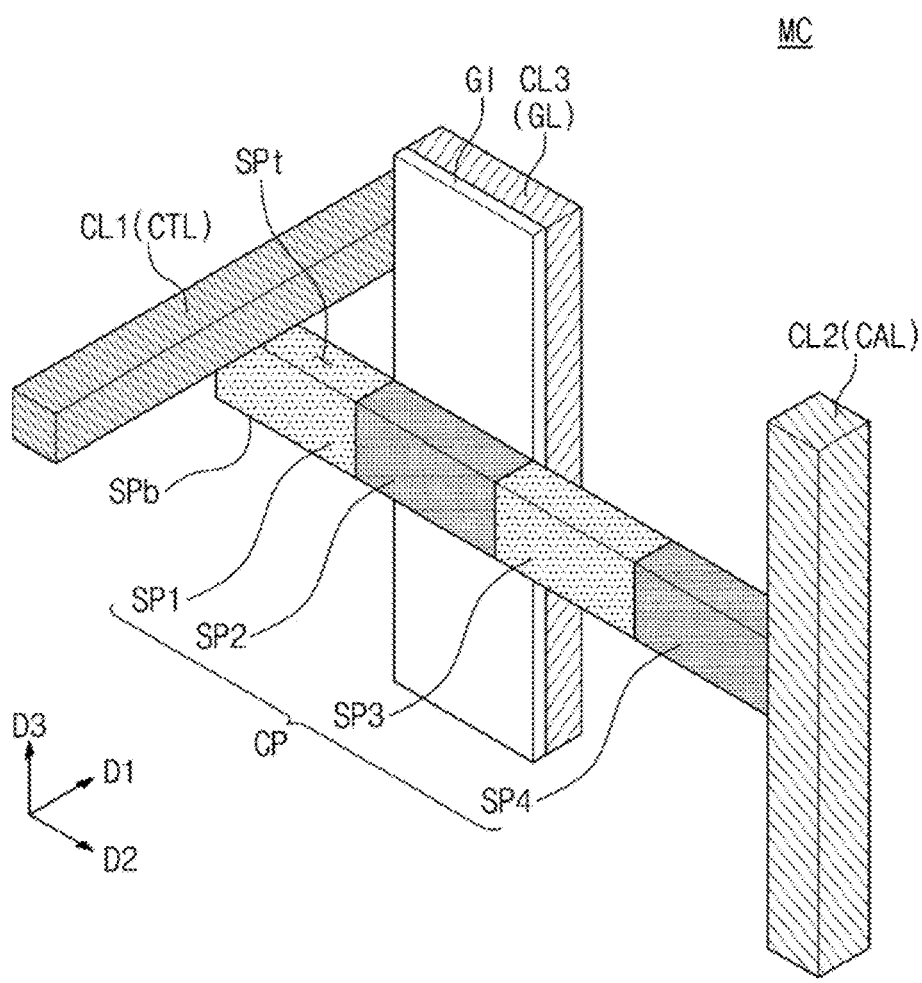
FIG. 10 is an enlarged perspective view illustrating a memory cell of a memory device of FIG. 9.
Figure 11:
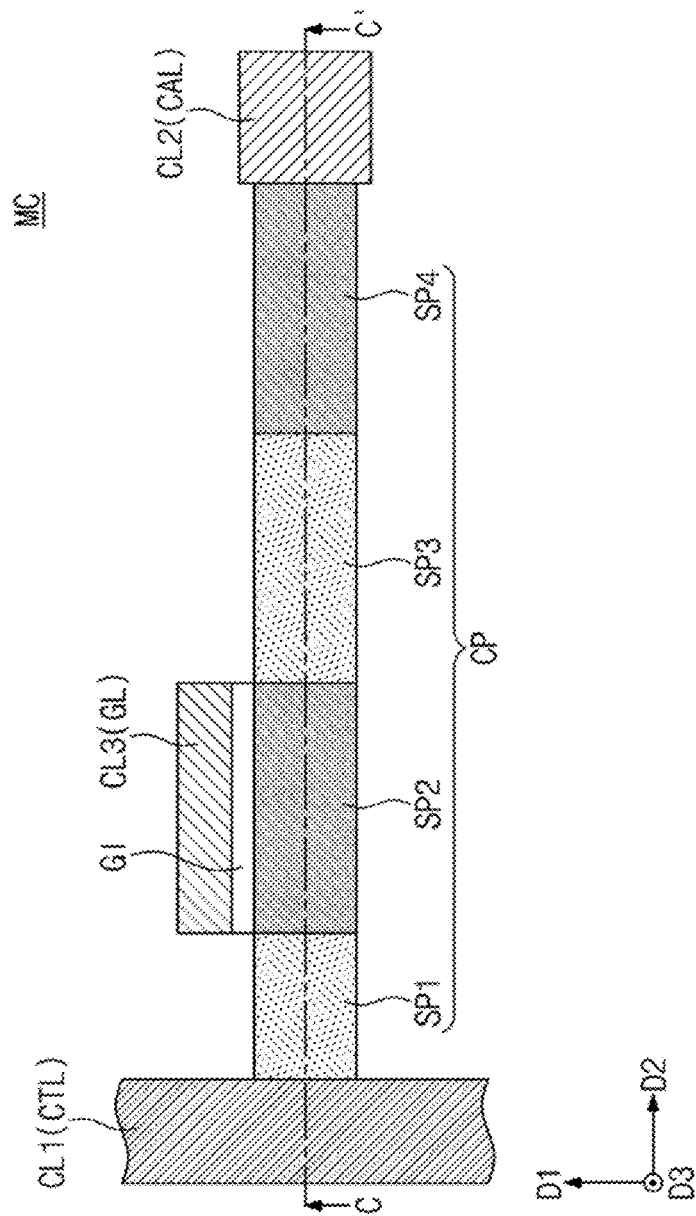
FIG. 11 is a plan view illustrating a memory cell of FIG. 10.
Figure 12:
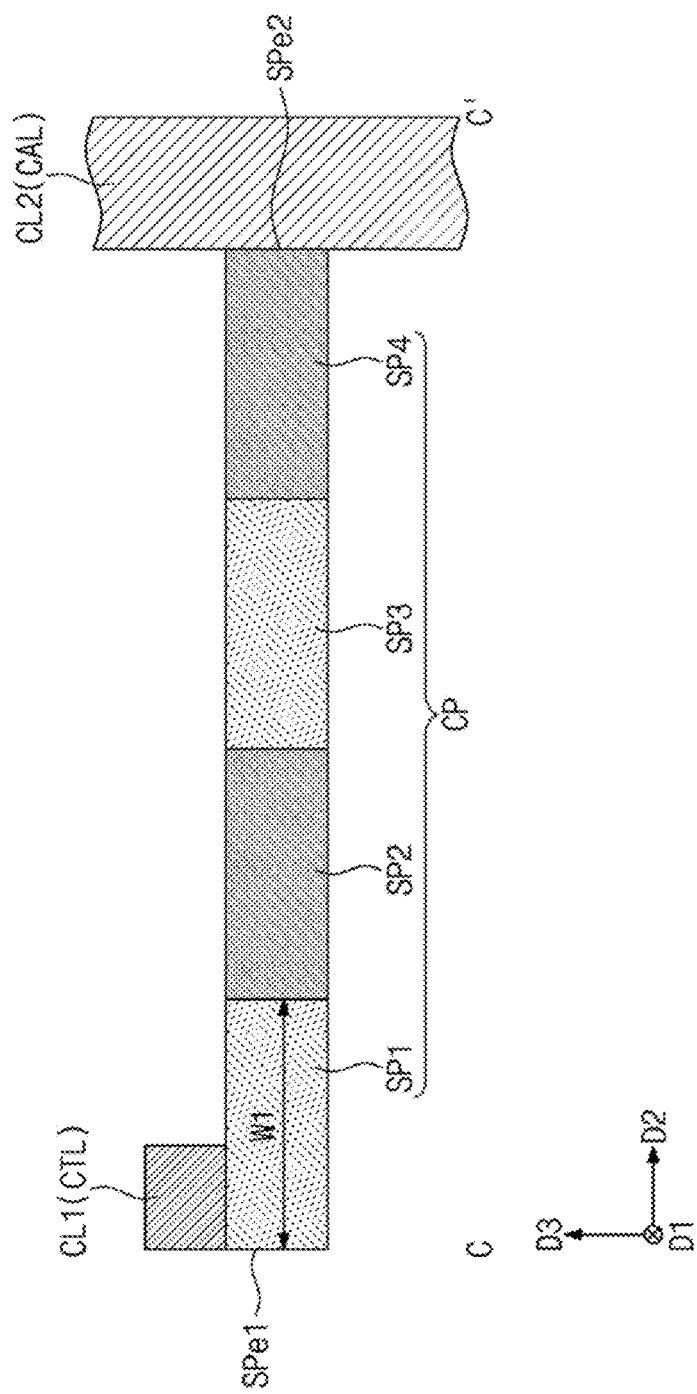
FIG. 12 is a sectional view taken along a line C-C' of FIG. 11.

FIG. 9 is a perspective view illustrating a three-dimensional semiconductor memory device according to an example embodiment. FIG. 10 is an enlarged perspective view illustrating a memory cell of a memory device of FIG. 9. FIG. 11 is a plan view illustrating a memory cell of FIG. 10. FIG. 12 is a sectional view taken along a line C-C' of FIG. 11.

Referring to FIGS. 8 to 12, a pair of the first and second sub-cell arrays SCA1 and SCA2, which are adjacent to each other and are described with reference to FIG. 8, may be provided on the substrate 100. The pair of the first and second sub-cell arrays SCA1 and SCA2 may be composed of stacks SS1 and SS2. The stacks SS1 and SS2 may include the first to third layers L1, L2, and L3, which are vertically stacked on the substrate 100. Each of the first to third layers L1, L2, and L3 may include a pair of the first conductive lines CL1, which are spaced apart from each other in the second direction D2, and a plurality of the semiconductor patterns CP, which are connected to each of the first conductive lines CL1.

Each of the semiconductor patterns CP may include the first sub-semiconductor pattern SP1, the second sub-semiconductor pattern SP2, the third sub-semiconductor pattern SP3, and the fourth sub-semiconductor pattern SP4. The second sub-semiconductor pattern SP2 may be disposed between the first and third sub-semiconductor patterns SP1 and SP3. The third sub-semiconductor pattern SP3 may be disposed between the second and fourth sub-semiconductor patterns SP2 and SP4.

Figure 16:
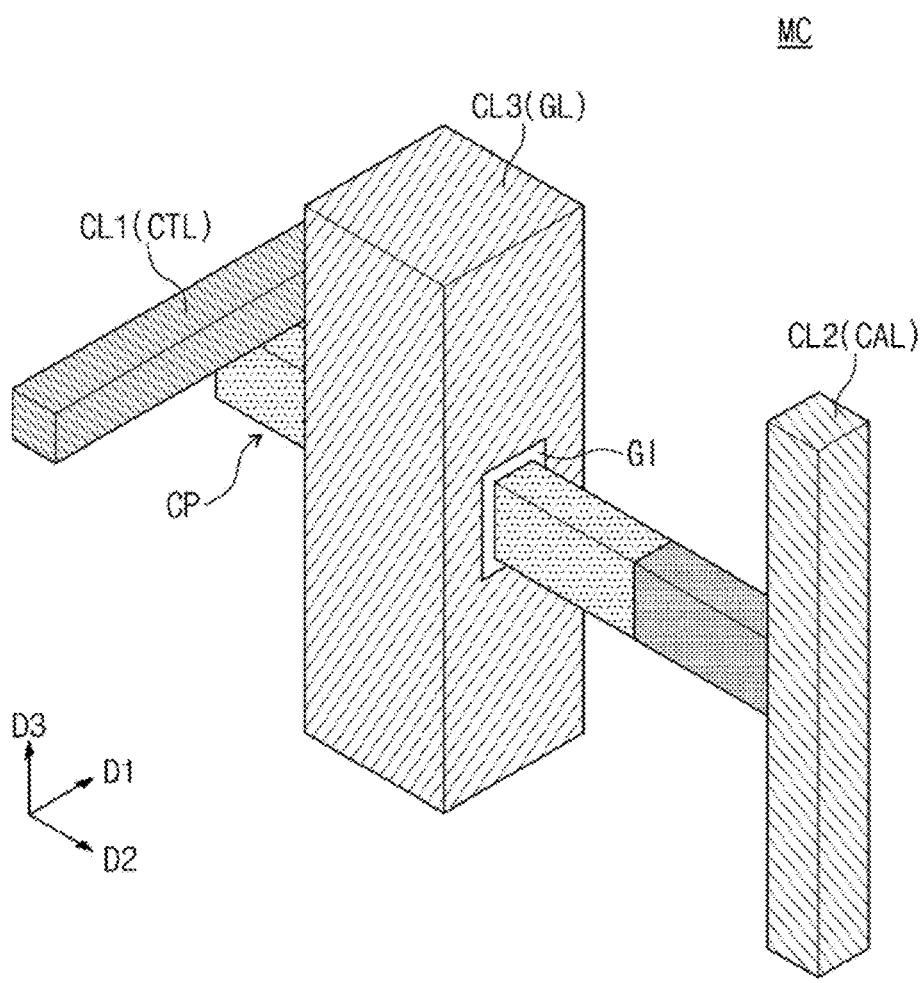
FIG. 16 is an enlarged perspective view illustrating a memory cell of a three-dimensional semiconductor memory device according to an example embodiment.

The first and second sub-semiconductor patterns SP1 and SP2 may correspond to a first diode constituting the memory cell MC of FIG. 16, and the third and fourth sub-semiconductor patterns SP3 and SP4 may correspond to a second diode constituting the memory cell MC of FIG. 8. As described above, the memory cell MC may be composed of a thyristor. The thyristor may include a first bipolar transistor, which is composed of the first to third sub-semiconductor patterns SP1, SP2, and SP3, and a second bipolar transistor, which is composed of the second to fourth sub-semiconductor patterns SP2, SP3, and SP4. The thyristor of the memory cell MC may have a floating body. The first conductive lines CL1 may be stacked in the third direction D3 and may be spaced apart from each other. The first conductive lines CL1 may be used as the cathode lines CTL described with reference to FIG. 8.

Third conductive lines CL3 penetrating the stacks SS1 and SS2 may be arranged in the first direction D1. The third conductive lines CL3 may be used as the gate lines GL described with reference to FIG. 8. The third conductive lines CL3 may be electrically disconnected from or isolated from the substrate 100.

The second conductive lines CL2 may be provided on the substrate 100 to penetrate a region between the first and second sub-cell arrays SCA1 and SCA2. When viewed in a plan view, each of the second conductive lines CL2 may be provided between a pair of the semiconductor patterns CP, which are adjacent to each other in the second direction D2.

Each of the second conductive lines CL2 may vertically extend between the fourth sub-semiconductor pattern SP4 of the semiconductor pattern CP of the first sub-cell array SCA1 and the fourth sub-semiconductor pattern SP4 of the semiconductor pattern CP of the second sub-cell array SCA2. Each of the second conductive lines CL2 may be connected in common to the fourth sub-semiconductor pattern SP4 of the semiconductor pattern CP of the first sub-cell array SCA1 and the fourth sub-semiconductor pattern SP4 of the semiconductor pattern CP of the second sub-cell array SCA2. The second conductive lines CL2 may be used as the common anode lines CAL described with reference to FIG. 8.

Although not shown, empty spaces in the stack SS may be filled with an insulating material. For example, the insulating material may be formed of or include one or more of silicon oxide, silicon nitride, or silicon oxynitride.

The memory cell MC of the semiconductor memory device of FIG. 9 will be described in more detail with reference to FIGS. 10 to 12. The first to fourth sub-semiconductor patterns SP1, SP2, SP3, and SP4 may be configured to have substantially the same features as those described with reference to FIG. 3 and FIGS. 5 to 7.

The semiconductor pattern CP may have a first end SPe1 and a second end SPe2, which are opposite to each other. The first sub-semiconductor pattern SP1 may be adjacent to the first end SPe1 of the semiconductor pattern CP. The fourth sub-semiconductor pattern SP4 may be adjacent to the second end SPe2 of the semiconductor pattern CP.

The first to fourth sub-semiconductor patterns SP1, SP2, SP3, and SP4 may extend parallel to the second direction D2, and all of the first to fourth sub-semiconductor patterns SP1, SP2, SP3, and SP4 may have a first width W1. The first width W1 may be, for example, about 0.7 nm. The first conductive line CL1 may be disposed on a top surface SPt of the semiconductor pattern CP. The first conductive line CL1 may be connected to the first sub-semiconductor pattern SP1.

The third conductive line CL3 may be adjacent to the second sub-semiconductor pattern SP2. The third conductive line CL3 may be provided on a sidewall of the second sub-semiconductor pattern SP2 and may extend in the third direction D3. A gate insulating layer GI may be disposed between the third conductive line CL3 and the second sub-semiconductor pattern SP2.

The second conductive line CL2 may be disposed to be adjacent to the second end SPe2 of the semiconductor pattern CP. The second conductive line CL2 may extend in the third direction D3. As an example, the second conductive line CL2 may be connected to the fourth sub-semiconductor pattern SP4.

In the semiconductor memory device described with reference to FIGS. 9 to 11, the third conductive line CL3 and the gate insulating layer GI may be omitted.

Hereinafter, various example embodiments will be described. In the following description, an element previously described with reference to FIGS. 8 to 12 may be identified by the same reference number without repeating an overlapping description thereof, and elements not described with reference to FIGS. 8 to 12 will be described in detail.

Figure 13:
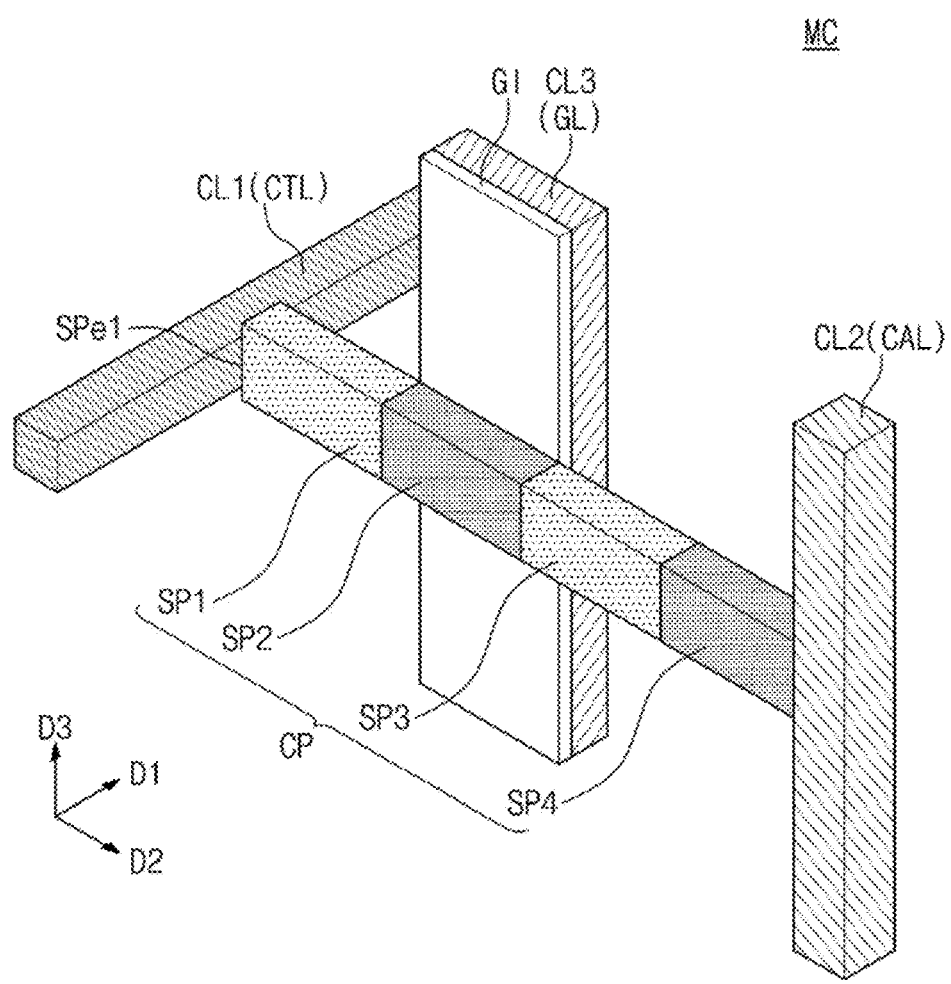
FIG. 13 is an enlarged perspective view illustrating a memory cell of a three-dimensional semiconductor memory device according to an example embodiment.
Figure 14:
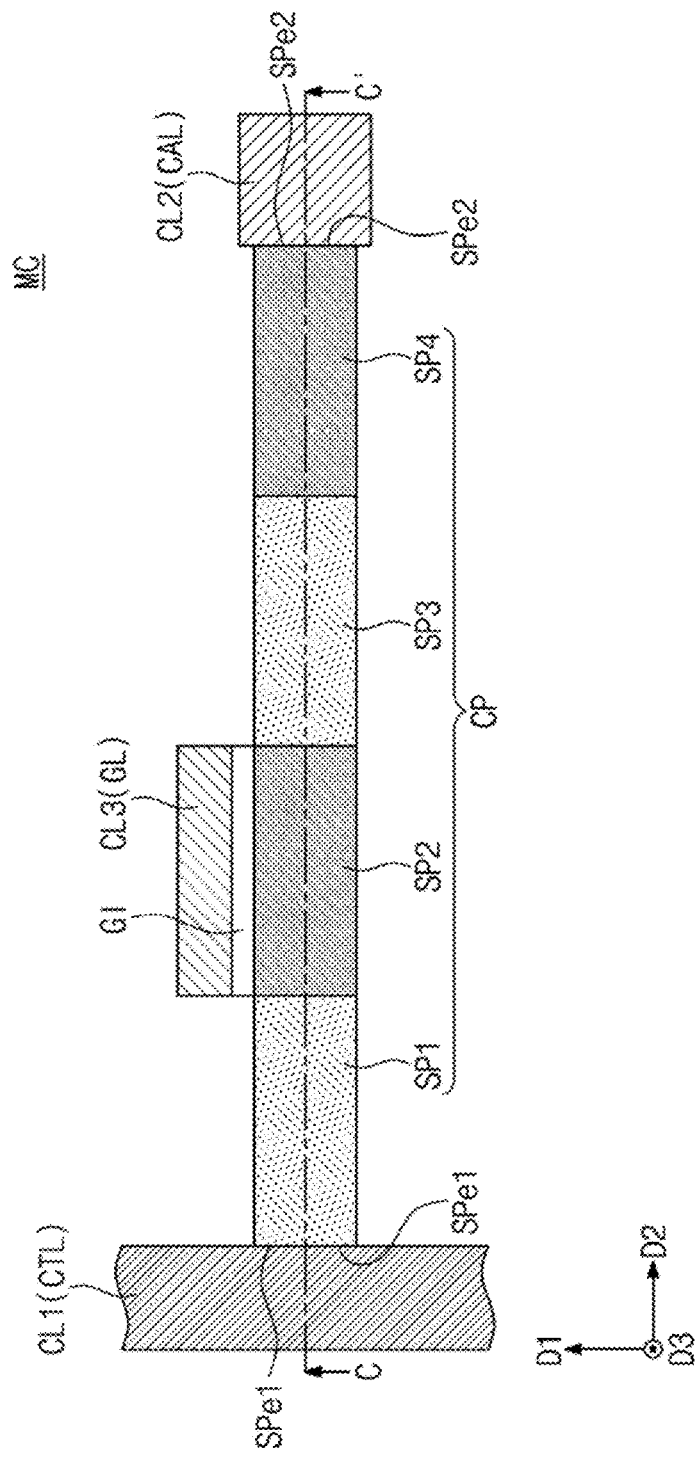
FIG. 14 is a plan view illustrating a memory cell of FIG. 13.
Figure 15:
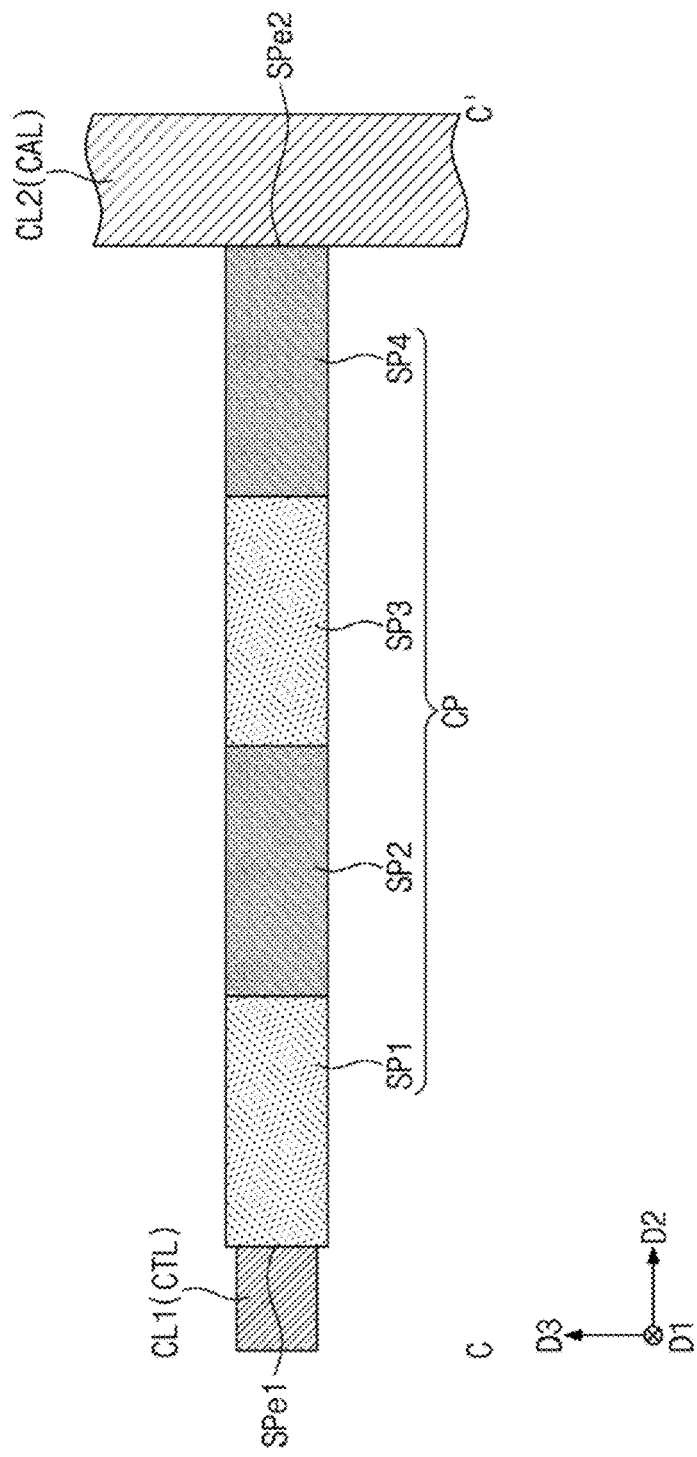
FIG. 15 is a sectional view taken along a line C-C' of FIG. 14.

FIG. 13 is an enlarged perspective view illustrating a memory cell of a three-dimensional semiconductor memory device according to an example embodiment. FIG. 14 is a plan view illustrating a memory cell of FIG. 13. FIG. 15 is a sectional view taken along a line C-C' of FIG. 14.

Referring to FIGS. 13 to 15, the first conductive line CL1 may be in direct contact with the first end SPe1 of the semiconductor pattern CP.

FIG. 16 is an enlarged perspective view illustrating a memory cell of a three-dimensional semiconductor memory device according to an example embodiment.

Referring to FIG. 16, the third conductive line CL3 may be provided to surround the second sub-semiconductor pattern SP2. The gate insulating layer GI may be interposed between the third conductive line CL3 and the second sub-semiconductor pattern SP2. A transistor including the third conductive line CL3 may be a gate-all-around transistor.

Figure 17:
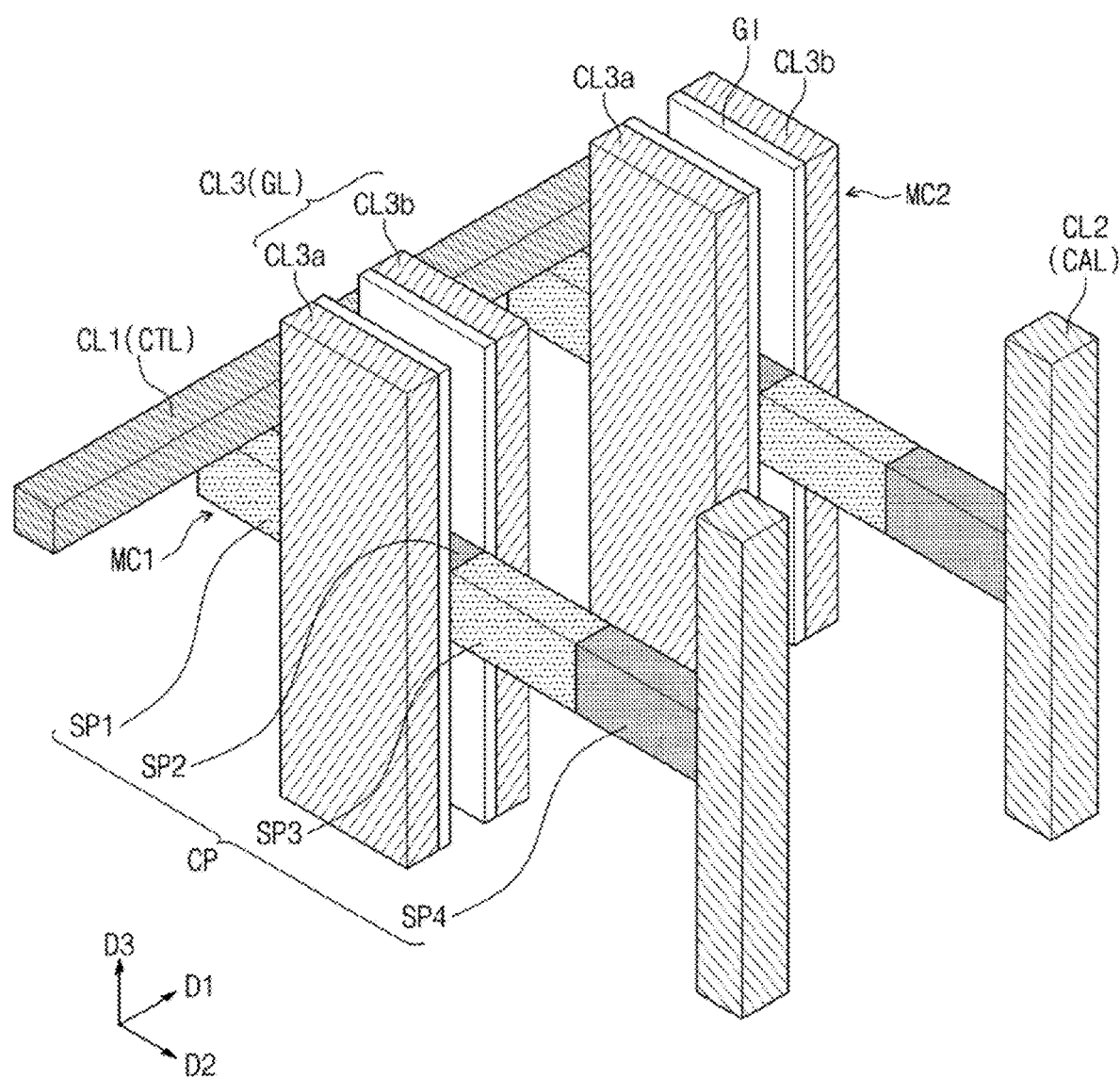
FIG. 17 is an enlarged perspective view illustrating first and second memory cells of a three-dimensional semiconductor memory device, according to an example embodiment.
Figure 18:
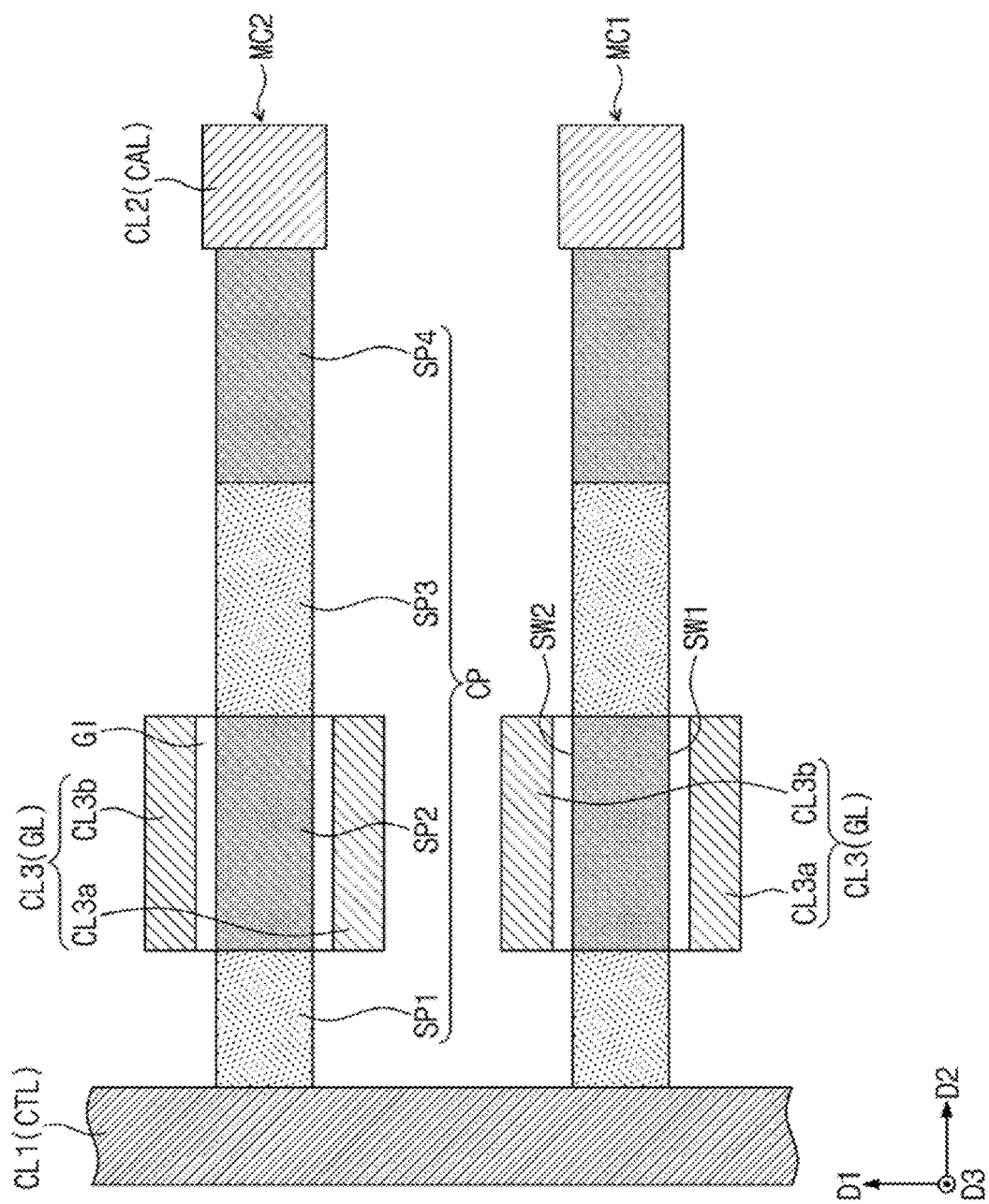
FIG. 18 is a plan view illustrating the first and second memory cells of FIG. 17.

FIG. 17 is an enlarged perspective view illustrating first and second memory cells of a three-dimensional semiconductor memory device, according to an example embodiment. FIG. 18 is a plan view illustrating the first and second memory cells of FIG. 17.

Referring to FIGS. 17 and 18, a first memory cell MC1 and a second memory cell MC2 may be provided in the first direction D1. The third conductive lines CL3 may be provided adjacent to the semiconductor patterns CP. Each of the third conductive lines CL3 may include a first sub-conductive line CL3a and a second sub-conductive line CL3b. Each of the semiconductor patterns CP may be interposed between a corresponding pair of the first sub-conductive line CL3a and the second sub-conductive line CL3b. The first sub-conductive line CL3a may be adjacent to a first sidewall SW1 of the second sub-semiconductor pattern SP2, and the second sub-conductive line CL3b may be adjacent to a second sidewall SW2 of the second sub-semiconductor pattern SP2. A first sub-conductive line CL2a and a second sub-conductive line CL2b may be connected to the same node, and the first sub-conductive line CL2a and the second sub-conductive line CL2b may be applied with the same electrical signal. The first sub-conductive line CL3a or the second sub-conductive line CL3b may serve as a back-gate electrode, and different electrical signals may be applied to the first sub-conductive line CL3a or the second sub-conductive line CL3b.

Figure 19:
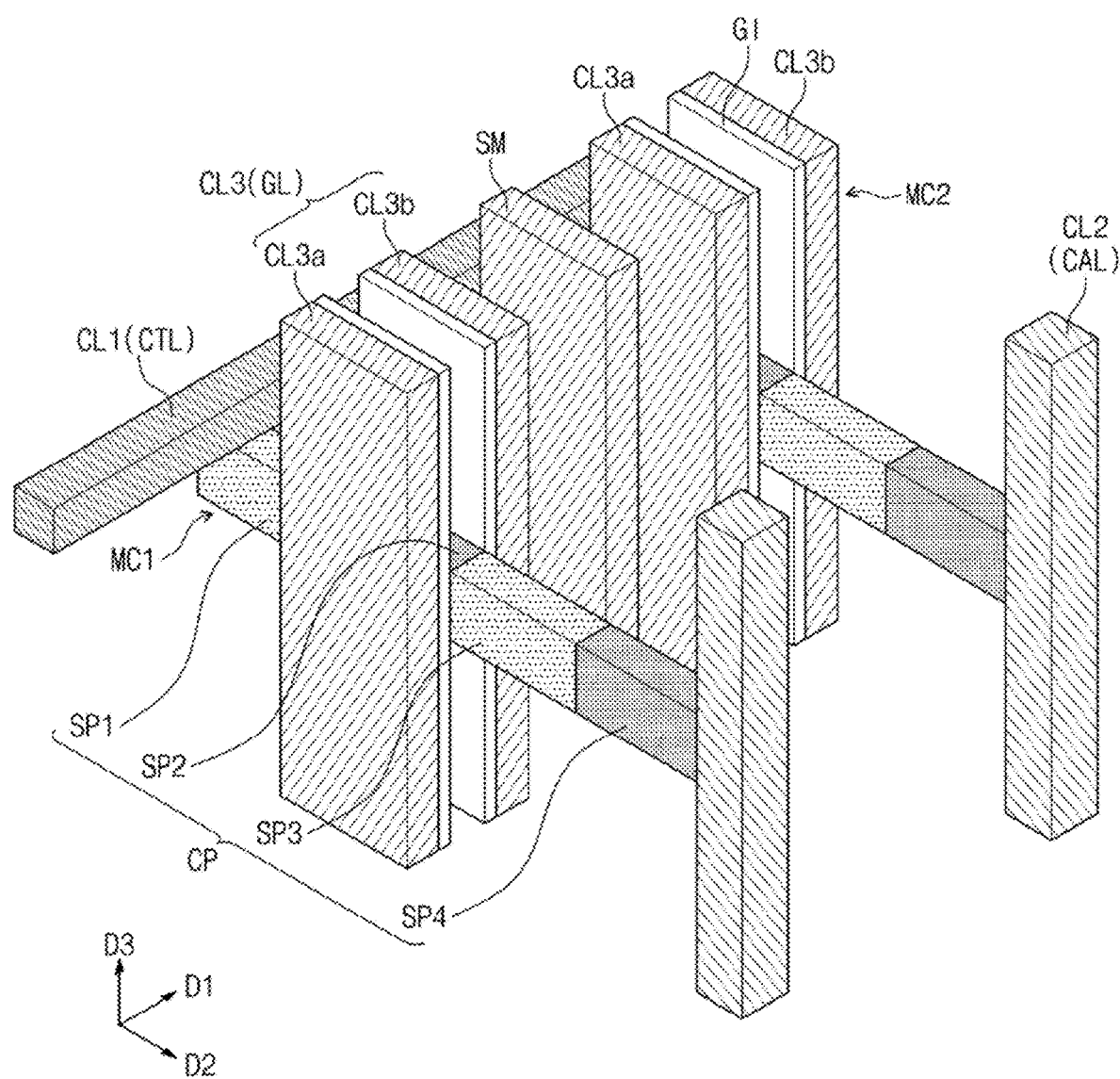
FIG. 19 is an enlarged perspective view illustrating first and second memory cells of a three-dimensional semiconductor memory device according to an example embodiment.

FIG. 19 is an enlarged perspective view illustrating first and second memory cells of a three-dimensional semiconductor memory device according to an example embodiment.

Referring to FIG. 19, a shielding line SM may be provided between the first and second memory cells MC1 and MC2 of FIG. 17. The shielding line SM may be provided between the second sub-conductive line CL2b of the first memory cell MC1 and the first sub-conductive line CL2a of the second memory cell MC2. The shielding line SM may prevent adjacent ones of the third conductive lines CL3 from being electrically coupled to each other.

Figure 20B:
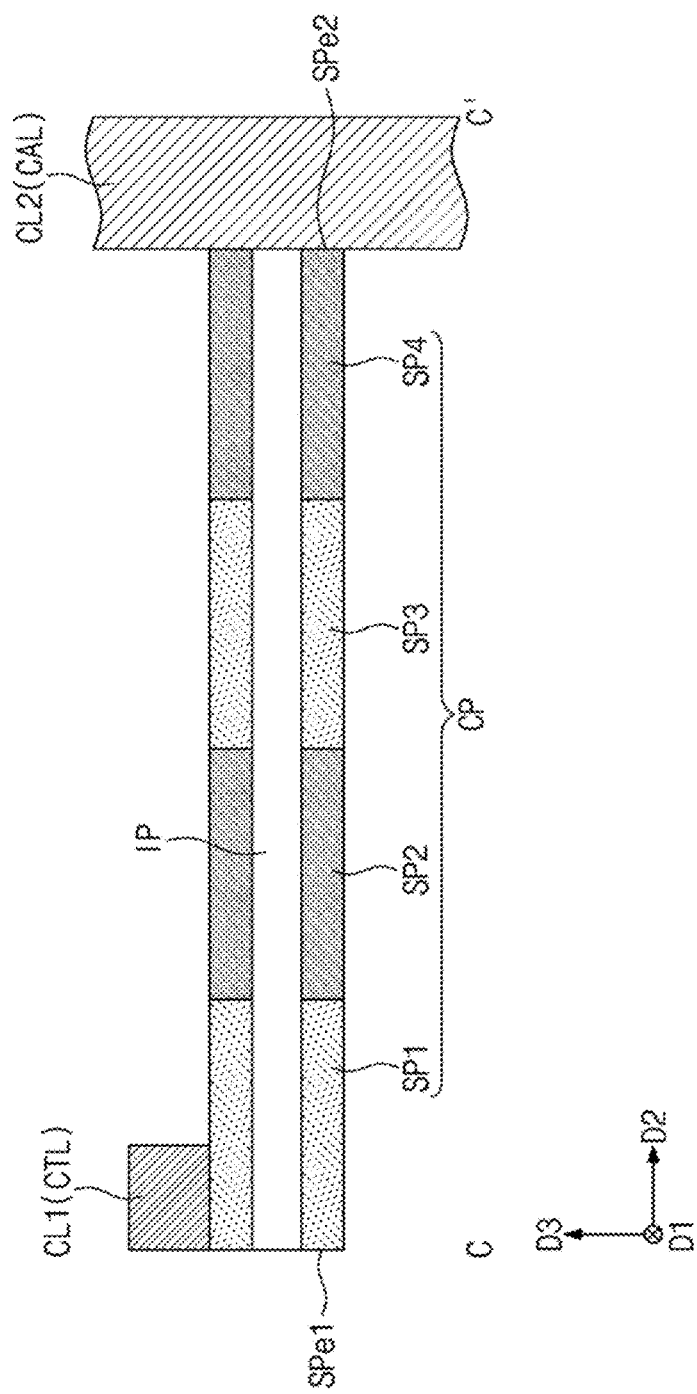
FIG. 20B is a sectional view taken along the line C-C' of FIG. 11.

FIG. 20A is a sectional view taken along the line C-C' of FIG. 14. FIG. 20B is a sectional view taken along the line C-C' of FIG. 11.

Referring to FIG. 20A, the penetration insulating pattern IP may be provided to penetrate the first to fourth sub-semiconductor patterns SP1, SP2, SP3, and SP4, and may be in contact with the first conductive line CL1 and the second conductive line CL2. Except for the afore-described difference, the semiconductor memory device according to the present example embodiment may have substantially the same features as that described with reference to FIGS. 1 to 19.

Referring to FIG. 20B, the penetration insulating pattern IP may be spaced apart from the first conductive line CL1 and may not be in contact with the first conductive line CL1.

Figure 21:
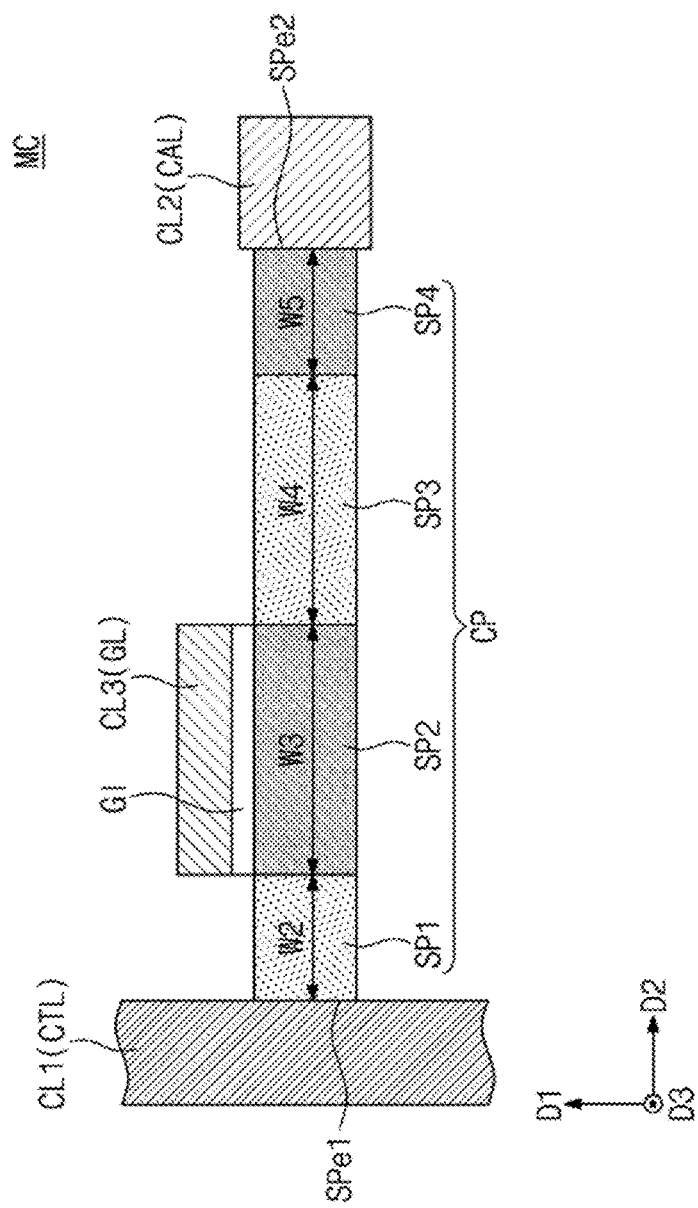
FIG. 21 is a plan view illustrating the memory cell of FIG. 13 according to an example embodiment.

FIG. 21 is a plan view illustrating the memory cell of FIG. 13 according to an example embodiment.

Referring to FIG. 21, the first sub-semiconductor pattern SP1 may have a second width W2 in the second direction D2. The second sub-semiconductor pattern SP2 may have a third width W3 in the second direction D2. The third sub-semiconductor pattern SP3 may have a fourth width W4 in the second direction D2. The fourth sub-semiconductor pattern SP4 may have a fifth width W5 in the second direction D2.

The third width W3 may be n times the fifth width W5, and the fourth width W4 may be m times the second width W2, where each of the numbers of n and m is a positive integer. In an example embodiment, the third conductive line CL3 may also have the third width W3 in the second direction D2.

By way of summation and review, expensive process equipment is used to increase pattern fineness in a semiconductor device, and the expense may limit cost-efficient integration for two-dimensional or planar semiconductor devices. To overcome such a limitation, three-dimensional semiconductor memory devices including three-dimensionally arranged memory cells have recently been proposed.

As described above, embodiments may provide a semiconductor memory device that has an increased integration density and can be operated with low power consumption.

According to an example embodiment, a three-dimensional semiconductor memory device may include first to fourth sub-semiconductor patterns, which are interposed between a first electrode and a second electrode and include a two-dimensional semiconductor material. This may make it possible to reduce a total vertical size of a memory cell and to reduce a holding current. Accordingly, it may be possible to provide a highly-integrated semiconductor memory device that can be operated with low power consumption.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor memory device, comprising:
a first electrode and a second electrode spaced apart from each other in a first direction; and
a first semiconductor pattern in contact with both of the first electrode and the second electrode, wherein:
the first semiconductor pattern includes first to fourth sub-semiconductor patterns, which are sequentially disposed in the first direction,
the first sub-semiconductor pattern is in contact with the first electrode,
the fourth sub-semiconductor pattern is in contact with the second electrode,
the first sub-semiconductor pattern and the third sub-semiconductor pattern are of a first conductivity type,
the second sub-semiconductor pattern and the fourth sub-semiconductor pattern are of a second conductivity type different from the first conductivity type,
each of the first to fourth sub-semiconductor patterns includes a transition metal and a chalcogen element,
the first sub-semiconductor pattern and the third sub-semiconductor pattern are formed of $MoS_a$ or $WS_b$,
the second sub-semiconductor pattern and the fourth sub-semiconductor pattern are formed of $MoSe_c$ or $WSe_d$,
subscripts a to d are each independently positive real numbers that are equal to or smaller than 2,
the subscript c is greater than the subscript a, and
the subscript d is greater than the subscript d.

2. The semiconductor memory device as claimed in claim 1, wherein each of the first to fourth sub-semiconductor patterns includes the chalcogen element in an amount that does not meet a stoichiometric ratio.

3. The semiconductor memory device as claimed in claim 1, further comprising a penetration insulating pattern, which is provided to sequentially penetrate the first to fourth sub-semiconductor patterns and to be in contact with the first and second electrodes,
wherein the first to fourth sub-semiconductor patterns surround the penetration insulating pattern.

4. The semiconductor memory device as claimed in claim 1, wherein:
the first sub-semiconductor pattern and the third sub-semiconductor pattern have a first thickness and a third thickness, respectively, in the first direction, and
the third thickness is n times the first thickness, where n is a positive integer.

5. The semiconductor memory device as claimed in claim 1, wherein:
the second sub-semiconductor pattern and the fourth sub-semiconductor pattern have a second thickness and a fourth thickness, respectively, in the first direction, and
the second thickness is m times the fourth thickness, where m is a positive integer.

6. The semiconductor memory device as claimed in claim 1, wherein:
each of the first sub-semiconductor pattern and the third sub-semiconductor pattern includes a first transition metal and a first chalcogen element, and
a content of the first chalcogen element included in the first sub-semiconductor pattern is different from a content of the first chalcogen element included in the third sub-semiconductor pattern.

7. The semiconductor memory device as claimed in claim 1, wherein:
each of the second sub-semiconductor pattern and the fourth sub-semiconductor pattern includes a second transition metal and a second chalcogen element, and
a content of the second chalcogen element included in the second sub-semiconductor pattern is different from a content of the second chalcogen element included in the fourth sub-semiconductor pattern.

8. The semiconductor memory device as claimed in claim 1, further comprising:
a third electrode adjacent to the second sub-semiconductor pattern; and
a gate insulating layer interposed between the second sub-semiconductor pattern and the third electrode.

9. The semiconductor memory device as claimed in claim 8, wherein
the third electrode surrounds the second sub-semiconductor pattern.

10. The semiconductor memory device as claimed in claim 1, wherein:

the first electrode includes a plurality of first electrodes, which are line-shaped patterns extending in a second direction crossing the first direction and are spaced apart from each other in a third direction crossing the first and second directions, the second electrode includes a plurality of second electrodes, which are line-shaped patterns extending in the third direction and are spaced apart from each other in the second direction, and the first semiconductor pattern includes a plurality of first semiconductor patterns, which are disposed at respective intersections of the first and second electrodes.

11. The semiconductor memory device as claimed in claim 10, further comprising a substrate disposed below the first electrode, wherein:

the first direction and the second direction are parallel to a top surface of the substrate, and the third direction is perpendicular to the top surface of the substrate.

12. The semiconductor memory device as claimed in claim 1, further comprising:

a third electrode spaced apart from the second electrode in the first direction; and a second semiconductor pattern, which is in direct contact with the second electrode and the third electrode and is spaced apart from the first electrode, wherein:

the second semiconductor pattern includes fifth to eighth sub-semiconductor patterns, which are sequentially disposed in a direction opposite to the first direction, the fifth sub-semiconductor pattern is in contact with the third electrode, the eighth sub-semiconductor pattern is in contact with the second electrode, the fifth sub-semiconductor pattern and the seventh sub-semiconductor pattern are of the first conductivity type, the sixth sub-semiconductor pattern and the eighth sub-semiconductor pattern are of the second conductivity type, and each of the fifth to eighth sub-semiconductor patterns includes a transition metal and a chalcogen element.

13. A semiconductor memory device, comprising:

a first electrode and a second electrode spaced apart from each other in a first direction;

a semiconductor pattern extending in the first direction between the first electrode and the second electrode to contact both of the first electrode and the second electrode, the semiconductor pattern including first to fourth sub-semiconductor patterns, which are sequentially disposed in the first direction with the first sub-semiconductor pattern being in contact with the first electrode, and the fourth sub-semiconductor pattern being in contact with the second electrode; and a penetration insulating pattern extending in the first direction and penetrating the first to fourth sub-semiconductor patterns of the semiconductor pattern, wherein:

each of the first to fourth sub-semiconductor patterns has a thickness in the first direction of 0.1 nm to less than 1 nm, each of the first to fourth sub-semiconductor patterns completely surrounds the penetration insulating pattern, in a second direction that is perpendicular to the first direction, each of the first to fourth sub-semiconductor patterns on sides of the penetration insulating pattern has a smaller width than the penetration insulating pattern, the first and third sub-semiconductor patterns are of a first conductivity type, and the second and fourth sub-semiconductor patterns are of a second conductivity type different from the first conductivity type, and the first and third sub-semiconductor patterns are formed of $MoS_a$ or $WS_b$, and the second and fourth sub-semiconductor patterns are formed of $MoSe_c$ or $WSe_d$, wherein a, b, c, and d are each independently positive real numbers that are equal to or smaller than 2, c>a, and b>d.

14. The semiconductor memory device as claimed in claim 13, wherein the penetration insulating pattern is spaced apart from the first electrode and is in contact with the second electrode.

15. The semiconductor memory device as claimed in claim 13, wherein each of the first to fourth sub-semiconductor patterns includes a two-dimensional semiconductor material.

16. The semiconductor memory device as claimed in claim 13, wherein each of the first to fourth sub-semiconductor patterns includes a transition metal and a chalcogen element, and each of the first to fourth sub-semiconductor patterns includes a chalcogen element in an amount that does not meet a stoichiometric ratio.

* * * * *